US010923328B2

(12) United States Patent
Tanikawa et al.

(10) Patent No.: US 10,923,328 B2
(45) Date of Patent: Feb. 16, 2021

(54) PLASMA PROCESSING METHOD AND PLASMA PROCESSING APPARATUS

(71) Applicant: TOKYO ELECTRON LIMITED, Tokyo (JP)

(72) Inventors: Takehiro Tanikawa, Miyagi (JP); Shinji Kawada, Miyagi (JP); Takayuki Semoto, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/012,852

(22) Filed: Jun. 20, 2018

(65) Prior Publication Data

US 2018/0374682 A1 Dec. 27, 2018

(30) Foreign Application Priority Data

Jun. 21, 2017 (JP) ................................. 2017-121714
Sep. 13, 2017 (JP) ................................. 2017-175364

(51) Int. Cl.
| | |
|---|---|
| H01J 37/32 | (2006.01) |
| H01L 21/02 | (2006.01) |
| H01L 21/67 | (2006.01) |
| H01L 21/683 | (2006.01) |
| H01L 21/3065 | (2006.01) |

(52) U.S. Cl.
CPC .. *H01J 37/32495* (2013.01); *H01J 37/32449* (2013.01); *H01L 21/02164* (2013.01); *H01L 21/02211* (2013.01); *H01L 21/02274* (2013.01); *H01L 21/67103* (2013.01); *H01L 21/67109* (2013.01); *H01L 21/67248* (2013.01); *H01L 21/67253* (2013.01); *H01L 21/6831* (2013.01); *H01J 37/32834* (2013.01); *H01J 2237/334* (2013.01); *H01J 2237/3321* (2013.01); *H01L 21/3065* (2013.01)

(58) Field of Classification Search
CPC ..................... H01J 37/32495; H01L 21/02274
See application file for complete search history.

(56) References Cited

U.S. PATENT DOCUMENTS

| | | | | |
|---|---|---|---|---|
| 9,139,901 | B2* | 9/2015 | Shimizu | H01L 21/32137 |
| 9,818,582 | B2* | 11/2017 | Murakami | H01J 37/32477 |
| 10,431,452 | B2* | 10/2019 | Takahashi | H01L 21/02312 |
| 2010/0127310 | A1* | 5/2010 | Tajiri | H01L 21/26506 |
| | | | | 257/288 |
| 2012/0126376 | A1 | 5/2012 | Honda et al. | |

(Continued)

FOREIGN PATENT DOCUMENTS

| | | |
|---|---|---|
| JP | 2016-12712 A | 1/2016 |
| WO | 2010/038887 A1 | 4/2010 |

*Primary Examiner* — Laura M Menz
*Assistant Examiner* — Khatib A Rahman
(74) *Attorney, Agent, or Firm* — Rothwell, Figg, Ernst & Manbeck, P.C.

(57) ABSTRACT

A plasma processing method includes a gas supply step and a film forming step. In the gas supply step, a gaseous mixture containing a compound gas containing a silicon element and a halogen element, an oxygen-containing gas, and an additional gas containing the same halogen element as the halogen element contained in the compound gas and no silicon element is supplied into a chamber. In the film forming step, a protective film is formed on a surface of a member in the chamber by plasma of the gaseous mixture supplied into the chamber.

10 Claims, 20 Drawing Sheets

(56) References Cited

U.S. PATENT DOCUMENTS

| | | | |
|---|---|---|---|
| 2013/0008607 A1* | 1/2013 | Matsumoto | H01J 37/32238 156/345.41 |
| 2016/0126114 A1* | 5/2016 | Kohno | H01J 37/32192 156/345.51 |
| 2017/0076956 A1* | 3/2017 | Hirayama | H01J 37/32449 |
| 2017/0182514 A1* | 6/2017 | Kumagai | H01J 37/32651 |
| 2017/0316919 A1* | 11/2017 | Hirayama | H01J 37/32082 |
| 2017/0323772 A1* | 11/2017 | Fenwick | C23C 14/46 |
| 2018/0197720 A1* | 7/2018 | Morikita | C23C 16/401 |
| 2018/0374682 A1* | 12/2018 | Tanikawa | H01L 21/02211 |

* cited by examiner

PLASMA PROCESSING METHOD AND PLASMA PROCESSING APPARATUS

CROSS-REFERENCE TO RELATED APPLICATIONS

This application claims priority to Japanese Patent Application Nos. 2017-121714 and 2017-175364 respectively filed on Jun. 21, 2017 and Sep. 13, 2017, the entire contents of which are incorporated herein by reference.

FIELD OF THE INVENTION

The present disclosure relates to a plasma processing method and a plasma processing apparatus.

BACKGROUND OF THE INVENTION

In semiconductor manufacturing process, a plasma processing apparatus for performing lamination of thin films, etching, or the like by using plasma is widely used. The plasma processing apparatus may be, e.g., a plasma CVD (Chemical Vapor Deposition) apparatus for performing lamination of thin films, a plasma etching apparatus for performing etching, or the like.

A member provided in a chamber of the plasma processing apparatus (hereinafter, may be referred to as "in-chamber member") is exposed to plasma of a processing gas during various plasma processes, and thus is made of a material that is hardly damaged by the plasma. As for a technique for further enhancing plasma resistance of the in-chamber member, there is known a technique for supplying a gaseous mixture of a silicon-containing gas and $O_2$ gas into the chamber to protect a surface of the in-chamber member by a silicon oxide film formed by the plasma of the gaseous mixture. As for the silicon-containing gas, $SiCl_4$, $SiF_4$ or the like is used, for example.

In addition, there is known a technique for loading a wafer (substrate to be processed) into a chamber of a plasma processing apparatus, supplying a gaseous mixture of $SiCl_4$ gas and $O_2$ gas into the chamber, processing the wafer by using plasma of the gaseous mixture, and forming a silicon oxide film on the wafer (see, e.g., Japanese Patent Application Publication No. 2016-12712 and PCT Publication No. 2010/038887).

Since the silicon-containing gas such as $SiCl_4$, $SiF_4$ or the like has high reactivity, silicon is dissociated by the plasma near a gas supply port and bonded with oxygen and, thus, a silicon oxide easily generated. Accordingly, a large amount of silicon oxide is deposited on a surface of an in-chamber member near the gas supply port. As a result, in the chamber, a portion where a silicon oxide film is thickly deposited and a portion where the silicon oxide film is thinly deposited are generated.

When the thickness of the silicon oxide film in the chamber is not uniform, the surface of the in-chamber member is damaged by the plasma at the portion where the silicon oxide film is thinly deposited in the case of removing the silicon oxide film by using the plasma. On the other hand, at the portion where the silicon oxide film is thickly deposited, the silicon oxide film not sufficiently removed. At the portion where the silicon oxide film is thickly deposited, the silicon oxide film is further deposited on the silicon oxide film that has been removed and the thickness of the silicon oxide film is increased. Then, the silicon oxide film is peeled off from the surface of the in-chamber member to be introduced as particles into the wafer to be processed.

Further, the silicon-containing gas such as $SiCl_4$, $SiF_4$ or the like has high reactivity, so that a silicon oxide is easily produced in the gas in the chamber by the plasma. The silicon oxide generated in the gas is deposited on the surface of the in-chamber member, thereby forming a silicon oxide film on the surface of the in-chamber member. However, the silicon oxide film formed by the deposition of the silicon oxide generated in the gas is fragile and easily peeled off. Therefore, the peeled-off silicon oxide film scatters as particles in the chamber during wafer processing.

Further, since the silicon-containing gas such as $SiCl_4$, $SiF_4$ or the like has high reactivity, the silicon oxide generated in the gas may enter a hole of the gas supply port depending on conditions. In that case, a silicon oxide film is deposited on a sidewall the gas supply port, and the gas supply port may be blocked by the deposited silicon oxide film.

SUMMARY OF THE INVENTION

In accordance with an aspect, there is provided a plasma processing method including a gas supply step and a film forming step. In the gas supply step, a gaseous mixture containing compound gas containing a silicon element and a halogen element, an oxygen-containing gas, and an additional gas containing the same halogen element as the halogen element contained in the compound gas and no silicon element is supplied into a chamber. In the film forming step, a protective film is formed on a surface of a member in the chamber by plasma of the gaseous mixture supplied into the chamber.

In accordance with another aspect, there is provided a plasma processing apparatus including: a chamber; a gas supply unit configured to supply into the chamber a gaseous mixture of a compound gas containing a silicon element and a halogen element, an oxygen-containing gas, and an additional gas containing the same halogen element as the halogen element contained in the compound gas and no silicon element; and a plasma generation unit configured to generate a plasma of the gaseous mixture in the chamber.

BRIEF DESCRIPTION OF THE DRAWINGS

The objects and features of the present disclosure will become apparent from the following description of embodiments, given in conjunction with the accompanying drawings, in which.

DETAILED DESCRIPTION OF THE EMBODIMENTS

Figure 1:
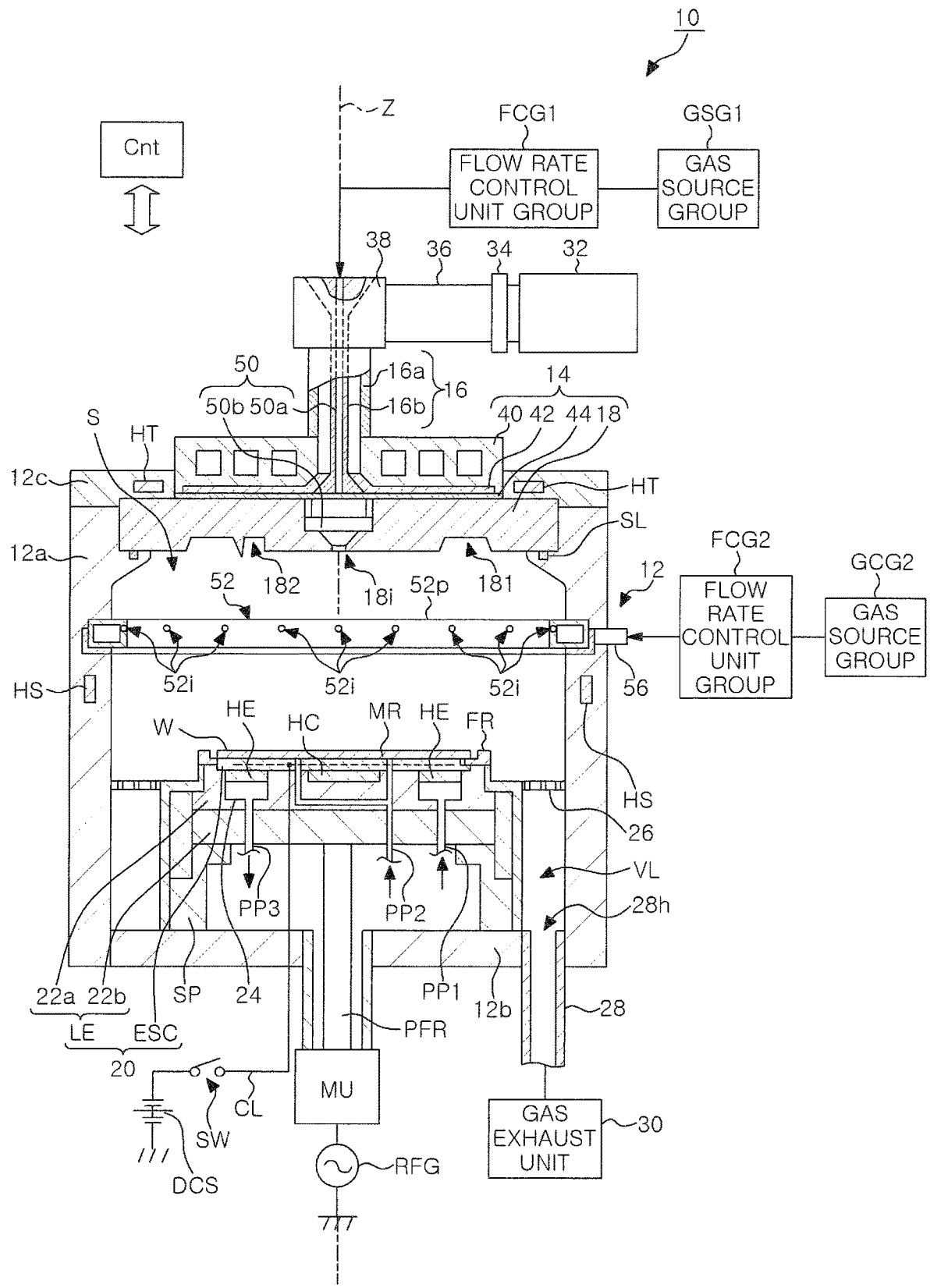
FIG. 1 is a cross sectional view schematically showing an example of a plasma processing apparatus.

In one embodiment, a plasma processing method includes a gas supply step and a film forming step. In the gas supply step, a gaseous mixture containing compound gas containing a silicon element and a halogen element, an oxygen-containing gas, and an additional gas containing the same halogen element as the halogen element contained in the compound gas and no silicon element is supplied into a chamber. In the film forming step, a protective film is formed on a surface of a member in the chamber by plasma of the gaseous mixture supplied into the chamber.

In one embodiment, a flow rate of the additional gas may be at least five times greater than flow rate of the compound gas.

In one embodiment, the flow rate of the additional gas may be 5 to 25 times greater than the flow rate of the compound gas.

In one embodiment, the compound gas may be $SiCl_4$ gas or compound gas.

In one embodiment, the compound gas may be $SiCl_4$ gas, and the additional gas may include at least one of $Cl_2$ gas, HCl gas, $BCl_3$ gas, $CCl_4$ gas or $CH_2Cl_2$ gas.

In one embodiment, the compound gas may be $SiF_4$ gas, and the additional gas may include at least one of $NF_3$ gas, $SF_6$ gas, HF gas, $CF_4$ gas, or $CHF_3$ gas.

In one embodiment, the oxygen-containing gas may include at least one of $O_2$ gas, CO gas, and $CO_2$ gas.

In one embodiment, the plasma processing method may further include: a loading step, a processing step, an unloading step and a removing step. In the loading, a target substrate is loaded into the chamber after the film forming step. In the processing step, a processing gas is supploed into the chamber to process the target substrate by using plasma of the processing gas after the loading step. In the unloading step, the target substrate is unloaded from the chamber after the processing step. In the removing step, a fluorine-containing gas is supplied into the chamber to remove the protective film in the chamber by using a plasma of the fluorine-containing gas after the unloading step. Further, the gas supplying step and the film forming step may be executed again after the removing step.

In one embodiment, the chamber may have a substantially cylindrical sidewall and an upper ceiling plate provided at an upper portion of the sidewall, and in the gas supplying step, the compound gas, the oxygen-containing gas and the additional gas may be supplied into the chamber from a plurality of sidewall gas supply ports provided along the sidewall, and a rare gas may be further supplied into the chamber from a ceiling plate gas supply port provided on an axis of the substantially cylindrical sidewall and disposed at a lower surface of the upper ceiling plate.

In one embodiment, a plasma processing apparatus includes: a chamber; a gas supply unit configured to supply into the chamber a gaseous mixture of a compound gas containing a silicon element and a halogen element, an oxygen-containing gas, and an additional as containing the same halogen element as the halogen element contained in the compound gas and no silicon element; and a plasma generation unit configured to generate a plasma of the gaseous mixture in the chamber.

Hereinafter, embodiments of the plasma processing method and the plasma processing apparatus will be described in detail with reference to the accompanying drawings. The embodiments are not intended to limit the plasma processing method and the plasma processing apparatus.

(Configuration of Plasma Processing Apparatus 10)

FIG. 1 is a cross sectional view schematically showing an example of a plasma processing apparatus 10. As shown in FIG. 1, for example, the plasma processing apparatus 10 includes a chamber 12. The chamber 12 provides a processing space S for accommodating a wafer W that is an example of a target substrate. The chamber 12 has a sidewall 12a, a bottom portion 12b, and a top portion 12c. The sidewall 12a has a substantially cylindrical shape having the Z-axis as an axis line. The Z-axis passes through the center of a mounting table to be described later in a vertical direction, for example.

The bottom portion 12b is provided at a lower end side of the sidewall 12a. An upper end portion of the sidewall 12a is opened. The opening at the upper end portion of the sidewall 12a is closed by a dielectric window 18. The dielectric window 18 is held between the upper end portion of the sidewall 12a and the top portion 12c. A sealing member SL may be interposed between the dielectric window 18 and the upper end portion of the sidewall 12a. The sealing member SL is, e.g., an O-ring, and contributes to sealing of the chamber 12.

In the chamber 12, the mounting table 20 is provided below the dielectric window 18. The mounting table 20 includes a lower electrode LE and an electrostatic chuck ESC. The lower electrode LE includes a first plate 22a and a second plate 22b which are made of, e.g., aluminum or the like, and have a substantially disc shape. The second plate 22b is supported by a cylindrical support SP. The support SP extends vertically upward from the bottom portion 12b. The first plate 22a is provided on the second plate 22b and is electrically connected to the second plate 22b.

The lower electrode LE is electrically connected to a high frequency power supply RFG through a power feed rod PFR and a matching unit MU. The high frequency power supply RFG supplies a high frequency bias power to the lower electrode LE. A frequency of the high frequency bias power generated by the high frequency power supply RFG is a predetermined frequency suitable for controlling energy of ions attracted into the wafer W, e.g., 13.56 MHz. The matching unit MU accommodates a matching device for matching an impedance of the high frequency power supply RFG side and an impedance of a load side (mainly the plasma and the chamber 12). The matching unit has therein, e.g., a blocking capacitor for self-bias generation and the like.

The electrostatic chuck ESC is provided on the first plate 22a. The electrostatic chuck ESC has a mounting region MR for mounting the wafer W which faces the processing space S. The mounting region MR is substantially circular region substantially orthogonal to the Z-axis and has a diameter substantially equal to or slightly smaller than that of the wafer W. Further, the mounting region MR constitutes an upper surface of the mounting table 20, and the center of the mounting region MR, i.e., the center of the mounting table 20, is positioned on the Z-axis.

The electrostatic chuck ESC holds the wafer W by an electrostatic attraction force. The electrostatic chuck ESC includes an attraction electrode provided in a dielectric member. A DC power supply DCS is connected to the attraction electrode of the electrostatic chuck ESC through a switch SW and a coating wire CL. The wafer W is attracted and held on the upper surface of the electrostatic chuck ESC by a Coulomb force generated by a DC voltage applied from the DC power supply DCS. A focus ring FR annularly surrounding a periphery of the wafer W is provided at a radially outer side of the electrostatic chuck ESC.

An annular flow path 24 is formed inside the first plate 22a. A coolant is supplied to the flow path 24 from a chiller unit through a line PP1. The coolant supplied to the flow path 24 is returned to the chiller unit through a line PP3. Further, in the plasma processing apparatus 10, a heat transfer gas, e.g., He gas or the like, from a heat transfer gas supply unit is supplied to a gap between the upper surface of the electrostatic chuck ESC and the backside of the wafer W through a supply line PP2.

A space is formed outside an outer periphery of the mounting table 20, i.e., between the mounting table 20 and the sidewall 12a. This space serves as a gas exhaust path VL having an annular shape when seen from the top. An annular baffle plate 26 having a plurality of through-holes is provided between the gas exhaust path and the processing space S. The gas exhaust path VL is connected to a gas exhaust line 28 through a gas exhaust port 28h. The gas exhaust line 28 is provided at the bottom portion 12b of the chamber 12. A gas exhaust unit 30 is connected to the gas exhaust line 28. The gas exhaust unit 30 has a vacuum pump such as a pressure controller, a turbo molecular pump, or the like. The gas exhaust unit 30 can decrease a pressure in the processing space S in the chamber 12 to a desired vacuum level. A gas supplied to the wafer W flows along the surface of the wafer W toward the outside of the edge of the wafer W by the gas exhaust unit 30 and is exhausted from the outer periphery of the mounting table 20 through the gas exhaust path VL.

Further, the plasma processing apparatus 10 of the present embodiment includes heaters HT, HS, HC, and HE as temperature control units. The heater HT is provided at the top portion 12c and extends annularly to surround an antenna 14. The heater HS is provided in the sidewall 12a and extends annularly. The heater HC is provided in the First plate 22a or in the electrostatic chunk ESC. The heater HC is provided below a center portion of the mounting region MR, i.e., at a region intersecting with the Z-axis. The heater HE extends annularly to surround the heater HC. The heater HE is provided below an outer peripheral portion of the mounting region MR.

The plasma processing apparatus 10 further includes the antenna 14, a coaxial waveguide 16, a microwave generator 32, a tuner 34, a waveguide 36, and a mode transducer 38. The antenna 14, the coaxial waveguide 16, the microwave generator 32, the tuner 34, the waveguide 36, and the mode transducer 38 constitute a plasma generation unit for exciting the gas supplied into the chamber 12.

The microwave generator 32 generates microwaves having a frequency of, e.g., 2.45 GHz. The microwave generator 32 is connected to an upper portion of the coaxial waveguide 16 through the tuner 34, the waveguide 36, and the mode transducer 38. The coaxial waveguide 16 extends along the Z-axis that is the central axis thereof.

The coaxial waveguide 16 includes an outer conductor 16a and an inner conductor 16b. The outer conductor 16a has a cylindrical shape extending around the Z-axis. A lower end of the outer conductor 16a is electrically connected to an upper portion of a cooling jacket 40 having a conductive surface. The inner conductor 16b has a cylindrical shape extending around the Z-axis and is provided coaxially with the outer conductor 16a inside the outer conductor 16a. A lower end of the inner conductor 16b is connected to a slot plate 44 of the antenna 14.

In the present embodiment, the antenna 14 is an RLSA (Radial Line Slot Antenna). The antenna 14 is disposed in opening formed at the top portion. 12c to face the mounting table 20. The antenna 14 includes the cooling jacket 40, a dielectric plate 42, a slot plate 44, and a dielectric window 18. The dielectric window 18 is an example of an upper ceiling plate. The dielectric plate 42 has a substantially disc shape, and shortens the wavelength of the microwave. The dielectric plate 42 is made of, e.g., quartz, alumina or the like, and is held between the slot plate 44 and the lower surface of the cooling jacket 40.

Figure 2:
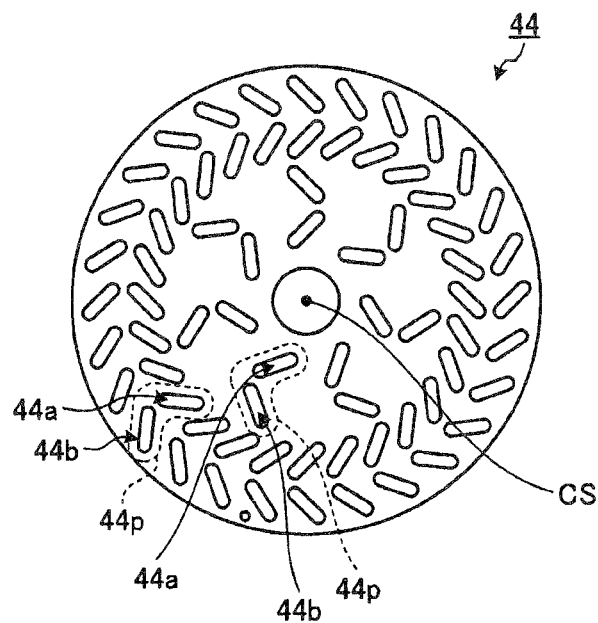
FIG. 2 is a top view showing an example of a slot plate.

FIG. 2 is a top view showing an example of the slot plate 44. The slot plate 44 is a thin disc-shaped plate. Opposite surfaces of the slot plate 44 in the plate thickness direction are flat. A center CS of the slot plate 44 is located on the Z-axis. The slot plate 44 is provided with a plurality of slot pairs 44p. Each of the slot pairs 44p includes two slot holes 44a and 44b penetrating in the plate thickness direction. Each of the slot holes 44a and 44b has, e.g., an elongated round shape, when seen from the top. In each slot pair 44p, an extension direction of a long axis of the slot hole 44a and an extension direction of a long axis of the slot hole 44b intersect with or are orthogonal to each other. The plurality of slot pairs 44p is arranged around the center CS to surround the center CS of the slot plate 44. In the example shown in FIG. 2, a plurality of slot pairs 44p is arranged along two concentric circles. On each concentric circle, the slot pairs 44p are arranged at an approximately equal interval. The slot plate 44 is provided on an upper surface 18u (see FIG. 4) of the dielectric window 18.

Figure 3:
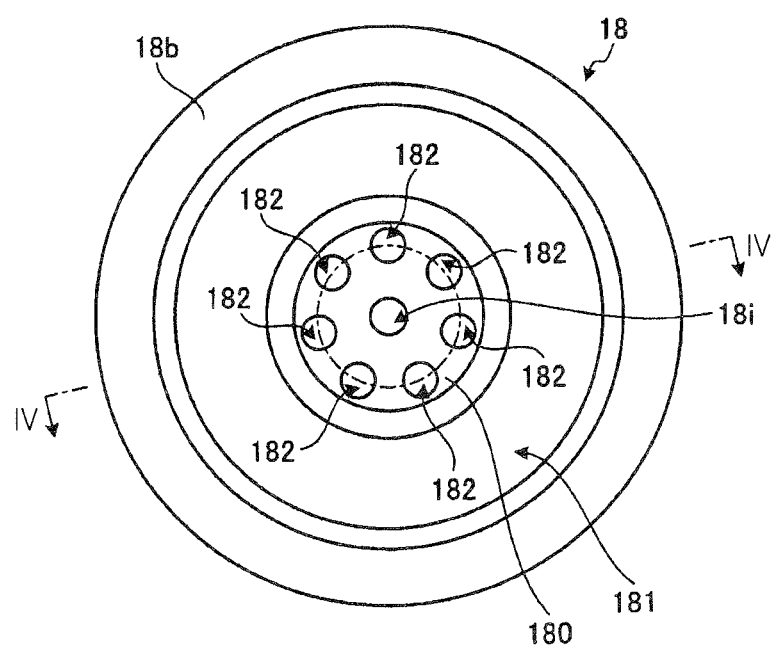
FIG. 3 is a top view showing an example of a dielectric window.
Figure 4:
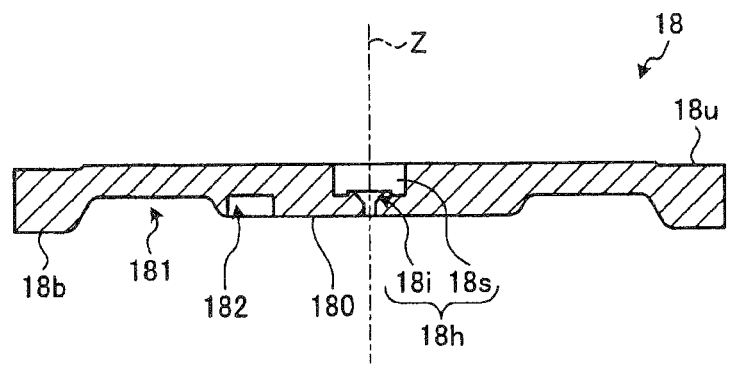
FIG. 4 is a cross sectional view taken along IV-IV of FIG. 3.

FIG. 3 is a top view showing an example of the dielectric window 18. FIG. 4 is a cross sectional view taken along a line IV-IV shown in FIG. 3. For example, as shown in FIGS. 3 and 4, the dielectric window 18 is formed in a substantially disc shape and made of a dielectric material such as quartz or the like. A through-hole 18h is formed at the center of the dielectric window 18. An upper portion of the through-hole 18h serves as a space 18s in which an injector 50b of a central gas introducing unit 50 to be described later is accommodated. A lower portion of the through-hole 18h serves as a gas injection port 18i of the central gas introducing unit 50. In the present embodiment, the center axis of the dielectric window 18 coincides with the Z-axis.

A surface of the dielectric window 18 which is opposite to the upper surface 18u, i.e., a lower surface 18b, faces the processing space S. The lower surface 18b defines various shapes. Specifically, the lower surface 18b has a flat surface 180 in a central region surrounding the gas injection port 18i. The flat surface 180 is orthogonal to the Z-axis. The lower surface 18b defines a first recess 181 having an annular shape. The first recess 181 extends annularly in a radial outer region of the flat surface 180, and is recessed in a tapered shape from a lower side toward an upper side.

Further, the lower surface 18b defines a plurality of second recesses 182. The second recesses 182 are recessed from a lower side toward an upper side. In the examples shown in FIGS. 3 and 4, the number of the second recesses 182 seven. However, the number of the second recesses 182 may be six or less, or may be eight or more. The second recesses 182 are arranged at an equal interval along the circumferential direction. Moreover, the second recesses 182 have a circular planar shape in a plane orthogonal to the Z-axis.

Figure 5:
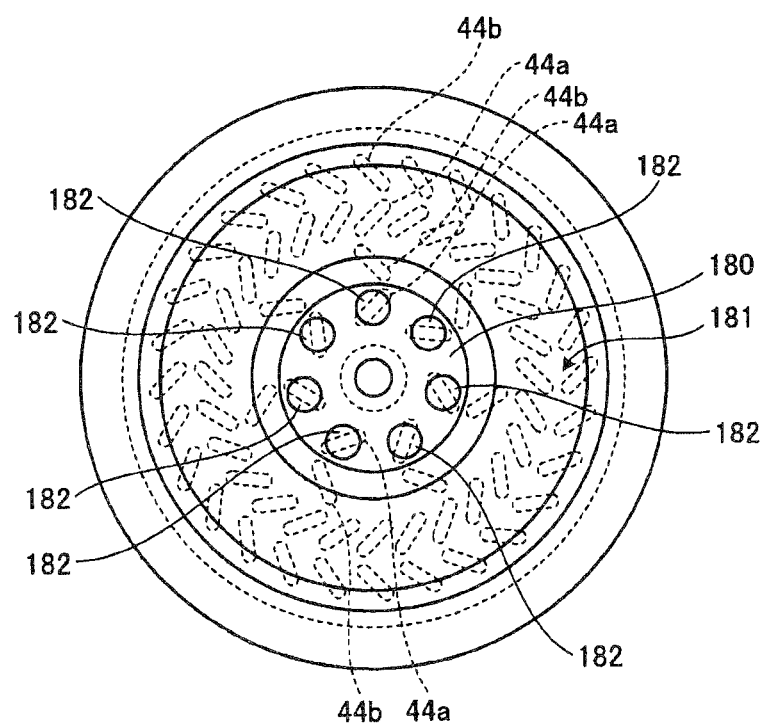
FIG. 5 is a top view showing a state in which the slot plate shown in FIG. 2 is provided on the dielectric window shown in FIG. 3.

FIG. 5 is a plan view showing a state in which the slot plate 44 shown in FIG. 2 is provided on the dielectric window 18 shown in FIG. 3. FIG. 5 shows the dielectric window 18 seen from the bottom. For example, as shown in FIG. 5, in a plan view, i.e., when seen from the Z-axis direction, the slot pair 44p provided at the slot plate 44 along the radial outer concentric circle are overlapped with the first recess 181 of the dielectric window 18. The slot holes 44b of the slot pairs 44p provided at the slot plate 44 along the radial inner concentric circle are overlapped with the first recess 181 of the dielectric window 18. Further, the slot holes 44a of the slot pairs 4 provided along the radial inner concentric circle are overlapped with the second recesses 182.

Referring back to FIG. 1, the microwave generated by the microwave generator 32 propagates, to the dielectric plate 42 while passing through the coaxial waveguide 16 and propagates through the slot holes 44a and 44b of the slot plate 44 to the dielectric window 18. The energy of the microwave propagated to the dielectric window concentrates on the first recess 181 and the second recesses 182 defined by a portion having a comparatively thin thickness, directly below the dielectric window 18. Therefore, the plasma processing apparatus 10 can generate plasma and distribute the plasma stably in the circumferential direction and in the radial direction The plasma processing apparatus 10 further includes a central gas introducing unit 50 and a peripheral gas introducing unit 52. The central gas introducing unit 50 includes a conduit 50a, an injector 50b, and the gas injection port 18i. The conduit 50a is provided inside the inner conductor 16b of the coaxial waveguide 16. The end of the conduit 50a extends into the space 18s (see FIG. 4) defined by the dielectric window 18 along the Z-axis. The injector 50b is accommodated in the space 18s below the end of the conduit 50a. The injector 50b is provided with a plurality of through-holes extending in the Z-axis direction. The dielectric window 18 has the above-described gas injection port 18i. The gas injection port 18i extends along the Z-axis below the space 18s and communicates with the space 18s. The central gas introducing unit 50 supplies a gas to the injector 50b through the conduit 50a, and injects the gas from the injector 50b into the processing space S through the gas injection port 18i. The central gas introducing unit 50 injects the gas into the processing space S directly below the dielectric window 18 along the Z-axis. In other words, in the processing space S, the central gas introducing unit 50 introduces the gas into a plasma generation region having a high electron temperature. The gas discharged from the central gas introducing unit 50 flows toward the central region of the wafer W substantially along the Z-axis. The gas injection port 18i is an example of a ceiling plate gas supply port.

A gas source group GSG1 is connected to the central gas introducing unit 50 through a flow rate control unit group FCG1. The gas source group GSG1 supplies a gaseous mixture containing a plurality of gases. The flow rate control unit group FCG1 includes a plurality of flow rate controllers and a plurality of on-off valves. The gas source group GSG1 is connected to the conduit 50a of the central gas introducing unit 50 through the flow rate controllers and the on-off valves in the flow rate control unit group FCG1.

As shown in FIG. 1, for example, the peripheral gas introducing unit 52 is provided between the gas injection port 18i of the dielectric window 18 and the upper surface of the mounting table 20 in the height direction, i.e., in the Z-axis direction. The peripheral gas introducing unit introduces a gas into the processing space S from a position along the sidewall 12a. The peripheral gas introducing unit 52 includes a plurality of gas injection ports 52i. The gas injection ports 52i are arranged along the inner surface of the sidewall 12a between the gas injection port 18i of the dielectric window 18 and the upper surface of the mounting table 20 in the height direction.

The peripheral gas introducing unit 52 includes an annular line 52p made of, e.g., quartz or the like. The gas injection ports 52i are formed at the line 52p. Each of the gas injection ports 52i injects the gas obliquely upward toward the Z-axis direction. The gas injection port 52i is an example of a sidewall gas supply port. The peripheral gas introducing unit 52 of the present embodiment has one line 52p, as shown in FIG. 1, for example. However, in another embodiment, the peripheral gas introducing unit 52 may have two or more lines 52p arranged in the vertical direction along the inner surface of the sidewall 12a of the chamber 12. A gas source group GSG2 is connected to the line 52p of the peripheral gas introducing unit 52 through a gas supply block 56 and a flow rate control unit group FCG2. The flow rate control unit group FCG2 includes a plurality of flow rate controllers and a plurality of on-off valves. The gas source group GSG2 is connected to the peripheral gas introducing unit 52 through the flow rate controllers and the on-off valves in the flow rate control unit group FCG2. The flow rate control unit groups FCG1 and FCG2 and the gas source groups GSG1 and GSG2 are examples of a gas supply unit.

The plasma processing apparatus 10 can independently control a type and a flow rate of a gas supplied into the processing space S from the central gas introducing unit 50 and a type and a flow rate of a supplied into the processing space S from the peripheral gas introducing unit 52. In the present embodiment, the plasma processing apparatus 10 supplies the same type of the gas into the processing space S from the central gas introducing unit 50 and the peripheral gas introducing unit 52. In the present embodiment, the flow rate of the gas supplied into the processing space S from the central gas introducing unit 50 and the flow rate of the gas supplied into the processing space S from the peripheral gas introducing unit 52 are set to be substantially the same.

As shown in. FIG. 1, for example, the plasma processing apparatus 10 includes a control unit Cnt including a processor, a memory, and the like. The control unit Cnt controls the respective components of the plasma processing apparatus 10 in accordance with a program and data such as a recipe or the like stored in the memory. For example, the control unit Cnt controls the flow rate controllers and the on-off valves in the flow rate control unit groups FCG1 and FCG2 and adjusts the flow rates of the gases introduced from the central gas introducing unit 50 and the peripheral gas introducing unit 52. Further, the control unit Cnt controls the microwave generator 32 to control the frequency and the power of the microwave generated by the microwave generator 32. Moreover, the control unit Cnt controls the high frequency power supply RFG to control the frequency and the power of the high frequency bias power generated by the high frequency power supply and the supply of the high frequency bias power and stop of the supply. Furthermore, the control unit Cnt controls the vacuum pump in the gas exhaust unit 30 to control the pressure in the chamber 12. Further, the control unit Cnt controls, the heaters HT, HS, HC, and HE to adjust temperatures of the respective components in the chamber 12.

(Processing Flow)

Figure 6:
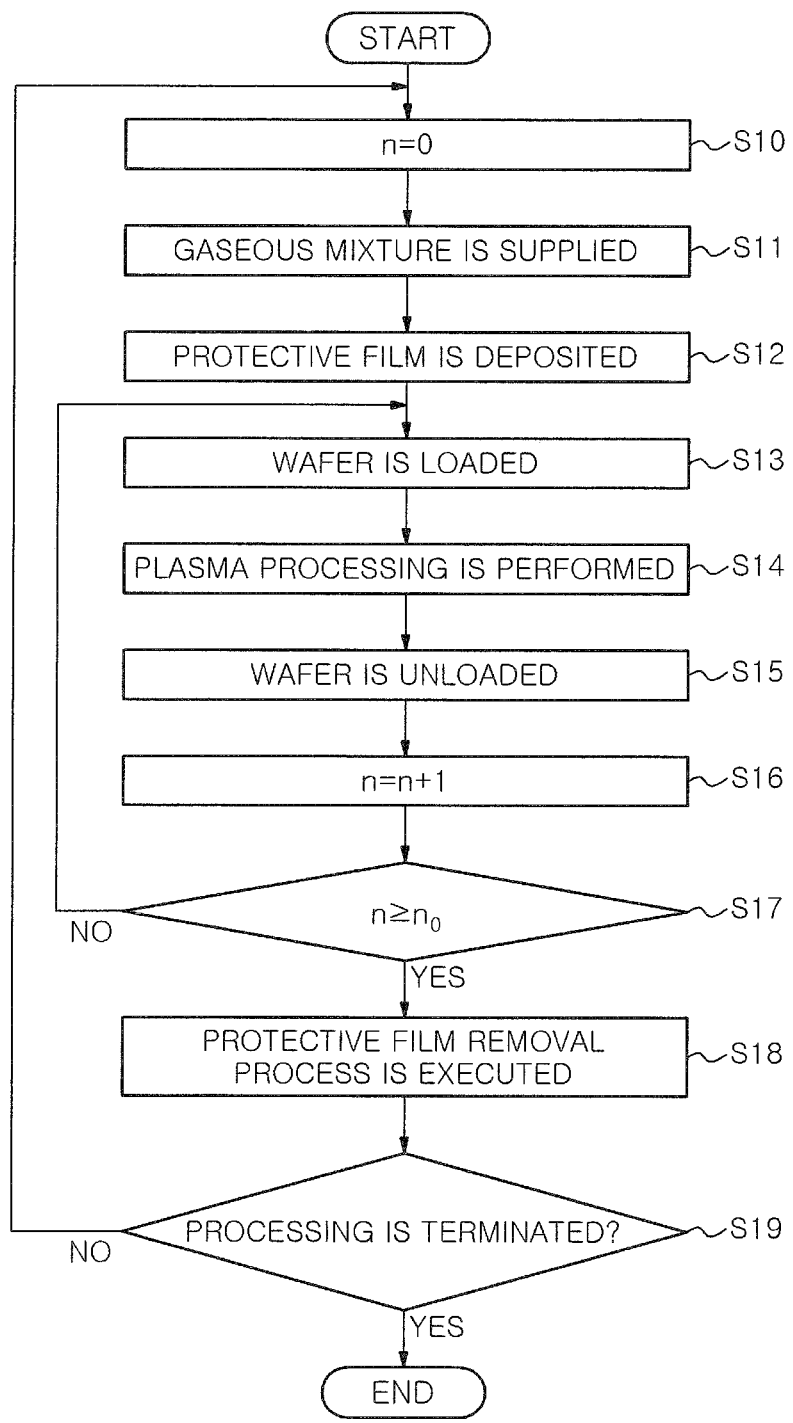
FIG. 6 is a flowchart showing an example of processing executed by the plasma processing apparatus.

The plasma processing apparatus 10 configured as described above performs the processing shown in FIG. 6, for example. FIG. 6 is a flowchart showing an example of the processing performed by the plasma processing apparatus 10.

First, the control unit Cnt initializes a variable n to 0 (S10). Then, the control unit Cnt performs a process of depositing a protective film on a surface of an in-chamber member in a state where the wafer W is not loaded into the chamber 12.

Specifically, the control unit Cnt controls the vacuum pump in the gas exhaust unit 30 to decrease the pressure in the chamber 12 to a predetermined vacuum level. Further, the control unit Cnt controls the heaters HT, HS, HC, and HE to adjust the temperatures of the respective components in the chamber 12 to predetermined levels. Then, the control unit Cnt controls the flow rate controllers and the on-off valves in the flow rate control unit groups FCG1 and FCG2 to supply the gaseous mixture containing a plurality of gases at a predetermined Low rate from the central gas introducing unit 50 and the peripheral gas introducing unit 52 into the processing space S (S11). The step S11 11 is an example of a supply step.

In the present embodiment, the gaseous mixture contains a compound gas (precursor gas) containing a silicon element and a halogen element, an oxygen-containing gas, an additional gas containing the same halogen element as that contained in the compound gas and silicon element. Specifically, the gaseous mixture contains $SiCl_4$ gas as the compound gas, $O_2$ gas as the oxygen-containing gas, and $Cl_2$ gas as the additional gas. In addition, the gaseous mixture contains Ar gas.

Then, the control unit cnt controls the microwave generator 32 to supply the microwave of, e.g., 2.45 GHz, into the processing space S at a predetermined power for a predetermined period of time. Accordingly, plasma of the gaseous mixture is generated in the processing space S, and a protective film having a predetermined thickness is deposited on the surface of the member in the chamber 12 (S12).

In the present embodiment, the protective film is a silicon oxide film. ($SiO_2$ firm). The step 12 is an example of a film forming step.

Next, the wafer W is loaded into the chamber 12 and mounted on the electrostatic chuck ESC of the mounting table 20 (S13). The control unit Cnt switches the switch SW from an OFF state to an ON state and applies a DC voltage from the DC power supply DOS, to the electrostatic chuck ESC. Accordingly, the wafer W is attracted and held on the upper surface of the electrostatic chuck ESC by the Coulomb force generated at the electrostatic chuck ESC. The step S13 is an example or a loading step.

Next, plasma processing is performed on the wafer W loaded into the chamber 12 (S14). Specifically, the control unit Cnt controls the vacuum pump in the gas exhaust unit 30 again to decrease the pressure in the chamber 12 to a predetermined vacuum level, and controls the heaters HT, HS, HC, and HE to adjust the temperatures of the respective components in the chamber 12 to predetermined levels. Then, the control unit Cnt controls the flow rate controllers and the on-off valves in the flow rate control unit groups FCG1 and FCG2, and supplies the processing gas used for the processing of the wafer W from the central gas introducing unit 50 and the peripheral gas introducing unit 52 into the processing space S. Then, the control unit Cnt controls the microwave generator 32 to supply the microwave of, e.g., 2.45 GHz, to the processing space S at a predetermined power for a predetermined period of time. Further, the control unit Cnt controls the high frequency power supply RFG to supply a high frequency bias power of, e.g., 13.65 MHz, to the lower electrode LE at a predetermined power for a predetermined period of time. As a result, the plasma of the processing gas is generated in the processing space S, and the predetermined processing such as etching, film formation or the like is performed on the surface of the wafer W by the generated plasma. The step S14 is an example of a processing step.

Next, the switch SW is switched from the ON state to the OFF state, and the wafer W is unloaded from the chamber 12 (S15). The step S15 is an example of an unloading step. Then, the control unit Cnt increases the variable n by 1 (S16) and determines whether or not the value of the variable n is greater than or equal to a redetermined value $n_0$ (S17). When the value of the variable n is less than the predetermined value $n_0$ (S17: No), the process shown in the step S13 is executed again.

On the other hand, when the value of the variable n is greater than or equal to the predetermined value $n_0$ (S17: Yes), a process of removing the protective film deposited on the surface of the member in the chamber 12 is executed (S18). Specifically, the control unit Cnt controls the vacuum pump in the gas exhaust unit 30 to decrease the pressure in the chamber 12 to a predetermined vacuum level. Further, the control unit Cnt controls the heaters HT, HS, HC, and HE to adjust the respective components in the chamber 12 to predetermined temperatures. The control unit Cnt controls the flow rate controllers and the on-off valves in the flow rate control unit groups FCG1 and FCG2 to supply a fluorine-containing gas at a predetermined flow rate from the central gas introducing unit 50 and the peripheral gas introducing unit 52 into the processing space S. The fluorine-containing gas includes, e.g., at least one of $NF_3$ gas, $SF_6$ gas and $CF_4$ gas.

Then, the control unit cnt controls the microwave generator 32 to supply the microwave of, e.g., 2.45 GHz, to the processing space S at a predetermined power for predetermined period of time. Accordingly, plasma of the fluorine-containing gas is generated in the processing space S, and the protective film deposited on the inner surface of the chamber 12 is removed by the generated plasma. The step S18 is an example of a removal step.

The control unit Cnt determines whether or not the processing for the wafer W is terminated (S19). (hen the processing is not terminated (S19: No), the processing shown in the step S10 is executed again. On the other hand, when the processing is terminated (S19: Yes), the plasma processing apparatus 10 terminates the processing shown in the flowchart.

In the plasma processing apparatus 10 of the present embodiment, the removal of the protective film (S18) and the deposition of the protective film. (S11 and. S12) are executed whenever a predetermined number ($n_0$ number) of wafers W are subjected to the plasma processing. Especially, when the ;predetermined value $n_0$ is 1, the removal of the protective film (S18) and the deposition of the protective film (S11 and S12) are performed whenever a single wafer W is subjected to the plasma processing.

(Test)

Figure 7:
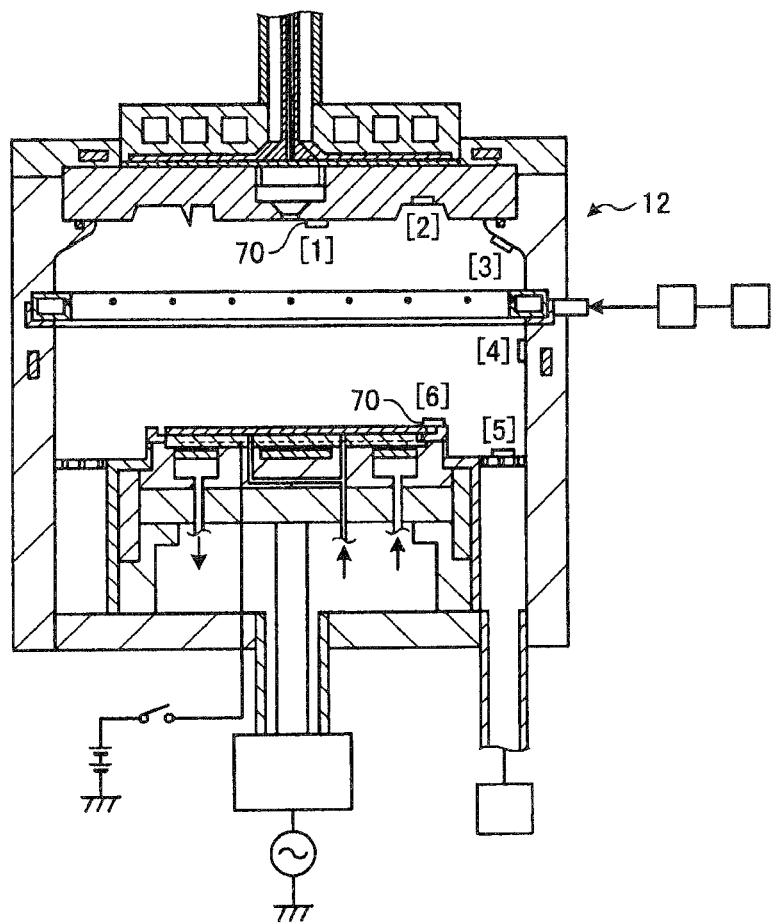
FIG. 7 shows a position of a test piece in a chamber.

A film thickness and a film quality of the protective film deposited on the surface of the member in the chamber in the protective film deposition process were tested. In the tests, as shown in FIG. 7, for example, a test piece 70 was placed at each of positions [1] to [6] in the chamber 12, and the film thickness and the film quality of the protective film deposited on the test piece 70 were measured. In the following tests, the test piece 70 in which an $SiO_2$ film having a thickness of 1 μm is formed on a silicon substrate was placed at each of the positions [1] to [6] in the chamber 12. FIG. 7 shows positions of the test pieces 70 disposed in the chamber 12. For example, as shown in FIG. 7, a position [1] is close to the gas injection port 18$i$ of the dielectric window 18, and positions [3] and [4] are close to the gas injection ports 52$i$ of the peripheral gas introducing unit 52.

COMPARATIVE EXAMPLE 1

Figure 8:
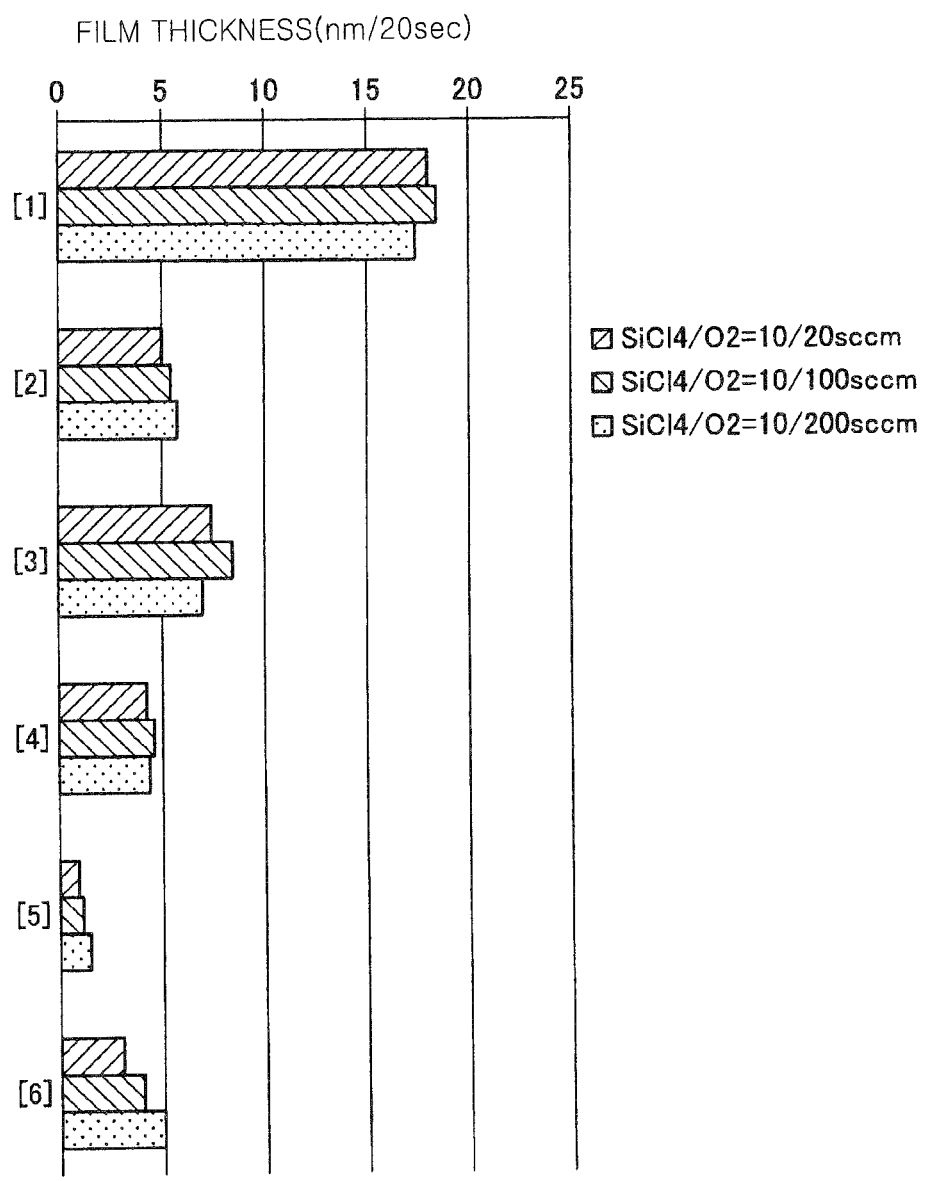
FIG. 8 shows a thickness of a protective film deposited on the test piece at each position in the case of varying a flow rate of $O_2$ gas in a comparative example 1.

First, a test was conducted on a comparative example 1. FIG. 8 shows film thicknesses of the protective film deposited on the test piece 70 at the respective positions in the case of varying the flow rate of $O_2$ gas in the comparative example 1. In the comparative example 1, in the protective film forming process, a gaseous mixture of Ar gas, $SiCl_4$ gas and $O_2$ gas was supplied into the chamber 12. The other conditions are as follows.

Microwave power: 1000 W
Pressure inside the chamber 12: 20 mT
RDC: 50%
Flow rate: Ar/$SiCl_4$/$O_2$=250/10/20 –200 sccm
RDC (Radial Distribution Control) is calculated as: ((Flow rate of gas supplied from gas injection port 18$i$)/(sum of flow rate of gas supplied from the gas injection port 18$i$ and flow rate of gas supplied from gas injection ports 52$i$))×100.

For example, as shown in FIG. 8, the protective films in the test piece 70 placed at the position [1] close to the gas injection port 18$i$ and the test pieces 70 placed at the positions [3] and [4] close to the gas injection ports 52$i$, are thicker than those in the test pieces 70 placed at the other positions. On the other hand, the protective films in the test pieces 70 placed at the positions [2], [5], and [6] far from the gas injection ports 18$i$ and 52$i$ are thinner than those in the test pieces 70 placed at the positions [1], [3] and [4]. The protective film tends to be thicker at a position close to the gas injection port than at a position far from the gas injection port. In the comparative example 1, as shown in. FIG. 8, for example, the tendency in which the protective film becomes thicker at the position close to the gas Injection port is not changed even if the flow rate of the $O_2$ gas is changed with respect to that of the $SiCl_4$ gas.

In the protective film deposition process, the following reactions (1) to (4) occur in the processing space S.

$$SiCl_4 \rightarrow Si^* + 4Cl^* \qquad (1)$$

$$SiCl_4 \leftarrow Si^* + 4Cl^* \qquad (2)$$

$$Si^* + O_2 \rightarrow SiO_2 \qquad (3)$$

$$Si^* + 2O^* \rightarrow SiO_2 \qquad (4)$$

Figure 9A:
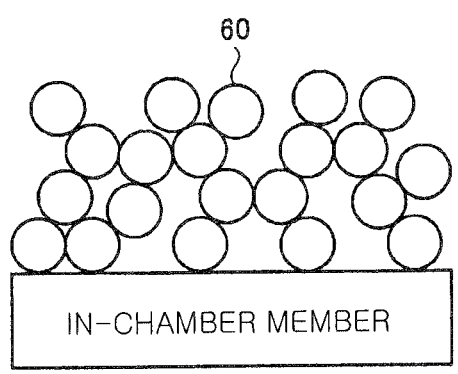
FIGS. 9A and 9B schematically show examples of a state in which the protective film is formed.
Figure 9B:
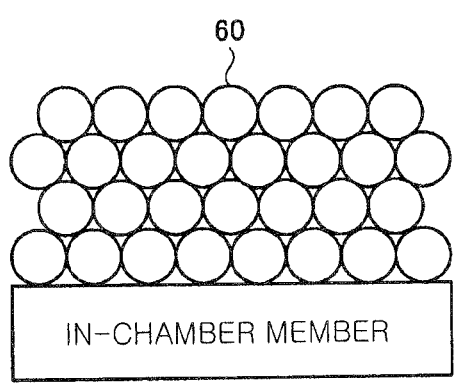

When the protective film is formed by depositing $SiO_2$ generated in the gas on the surface of the member in the chamber 12, large gaps exist between particles 60 in the protective film as shown in FIG. 9A, for example. When there are large gaps between the particles 60, ions and radicals in the plasma collide with the particles and, thus the particles 60 are easily peeled off. FIGS. 9A and 9B schematically show examples of state in which the protective film is formed.

On the other hand, when the reactions shown in the above formulas (3) and (4) occur on the surface of the member in the chamber 12, a dense protective film having a small gap between the particles 60 is formed as shown in FIG. 9E, for example. In the protective film having a small gap between the particles 60, the particles 60 are hardly peeled off even if ions and radicals in the plasma collide with the particles 60.

In the comparative example 1, as the flow rate of $O_2$ gas is decreased, $O_2$ and $O^*$ are decreased in the processing space S. Therefore, the reactions shown in the above formulas (3) and (4) are suppressed. Accordingly, $Si^*$ generated by the reaction shown in the above formula (1) spreads in the chamber 12 without forming $SiO_2$. As a result, it is expected that the reactions shown in the formulas (3) and (4) occur on the surface of the member in the chamber 12 and the film quality of the protective film is improved.

Figure 10:
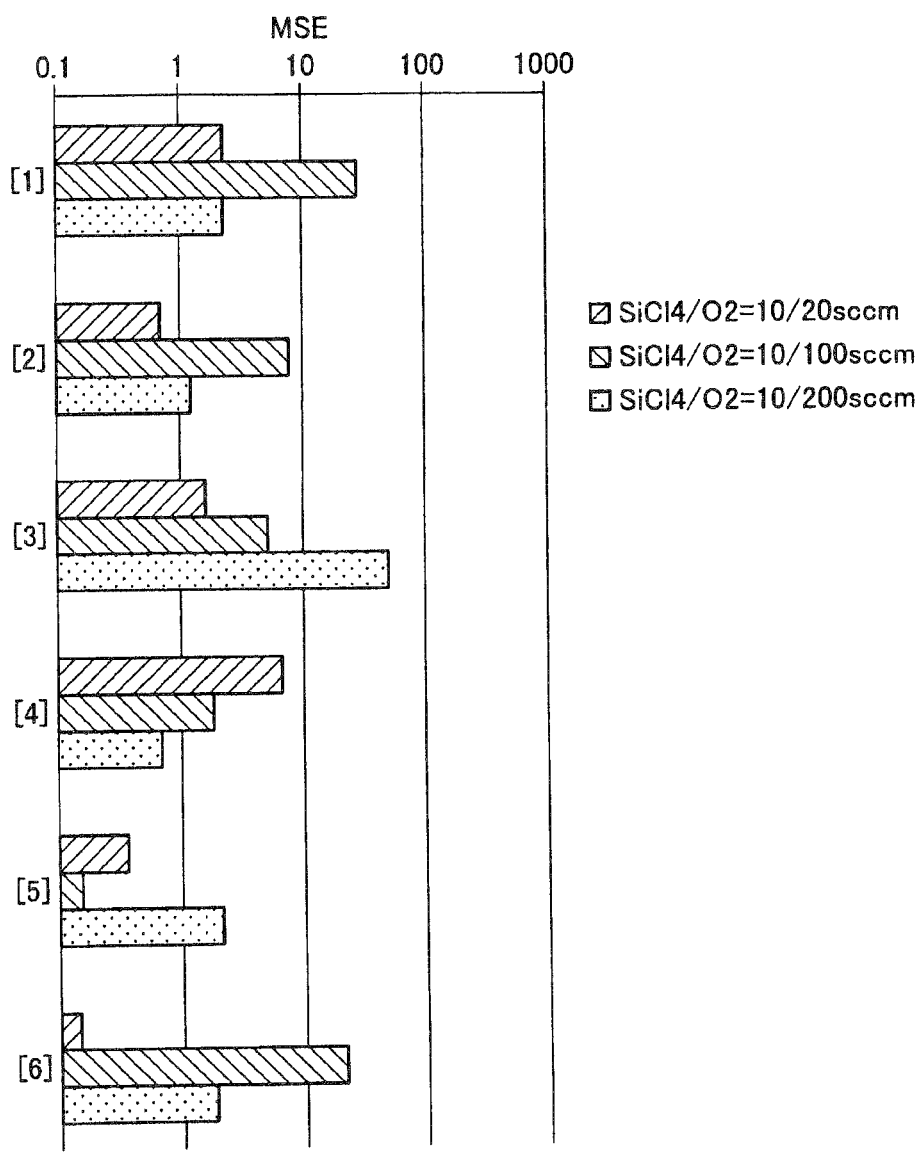
FIG. 10 shows a film quality of the protective film deposited on the test piece at each position in the case of varying the flow rate of $O_2$ gas in the comparative example 1.
Figure 11:
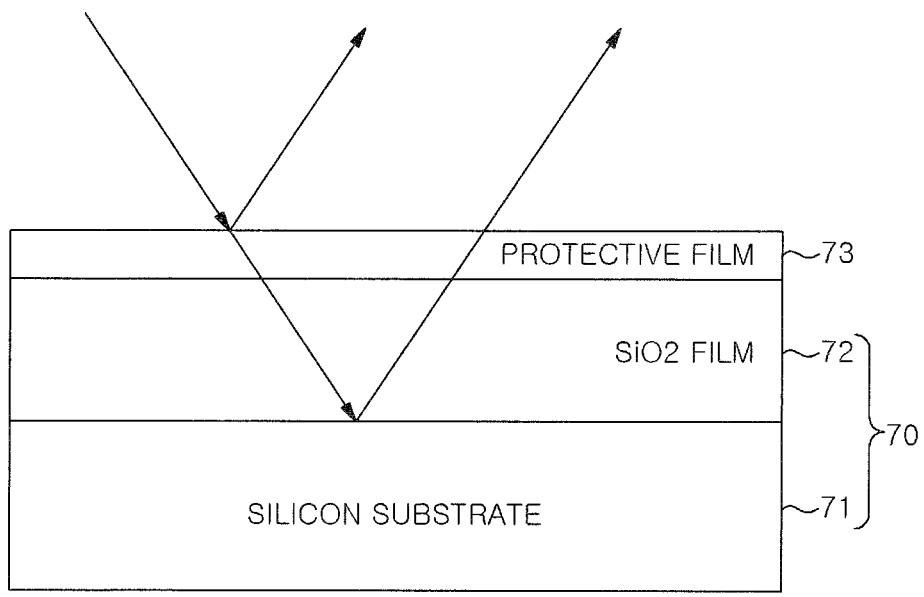
FIG. 11 explains an example of a method for measuring a film quality.

FIG. 10 shows the film quality of the protective film deposited on the test piece 70 at each position in the case of varying the flow rate of $O_2$ gas in the comparative example 1. In the case of measuring the film quality of the protective film, a difference in polarization states between an $SiO_2$ film 72 and a protective film 73 was evaluated as the film quality by using the reflected light of the $SiO_2$ film 72 on a silicon substrate 71 of the test piece 70 and the reflected light of the protective film 73 deposited on the $SiO_2$ film 72, as can be seen from FIG. 11, for example. FIG. 11 explains an example of a method for measuring a film quality. Specifically, an MSE (mean square error) of an intensity ratio Ψ and a phase difference Δ of the reflected light of the $SiO_2$ film 72 and the reflected light of the protective film which are measured by spectroscopic ellipsometry is calculated by the following equation (5).

$$MSE = \frac{1}{2N-M} \sum_{i=1}^{N} \left[ \left( \frac{\Psi_i^{mod} - \Psi_i^{exp}}{\sigma_{\Psi_i}^{exp}} \right)^2 + \left( \frac{\Delta_i^{mod} - \Delta_i^{exp}}{\sigma_{\Delta_i}^{exp}} \right)^2 \right] = \frac{1}{2N-M} \chi^2 \qquad (5)$$

In the Eq. (5), "i" represents an i-th value specified by a wavelength and an incident angle; "σ" represents a standard deviation; "N" represents the number of Ψ and Δ; and "M" represents the number of fitting parameters. In addition, "mod" represents a theoretical value of the reflected light of the $SiO_2$ film; "exp" represents measured values of the reflected lights of the $SiO_2$ film 72 and the protective film 73.

If the protective film 73 is an ideal $SiO_2$ film, the refractive index of the $SiO_2$ film 72 and the protective film 73 is close to that of the $SiO_2$ film and, thus, the value of MSE calculated based on the above formula (5) becomes 0. In other words, as the value of MSE is decreased, the film quality of the protective film 73 becomes closer to the ideal film quality of the $SiO_2$ film (e.g., the state shown in FIG. 9B) and the film quality of the protective film 73 is improved. On the other hand, if the protective film 73 is different from the ideal $SiO_2$ film, the refractive indexes of the protective film 73 and the $SiO_2$ film 72 are deviated from the refractive index of the $SiO_2$ film and, thus, the value of MSE calculated based on the above formula (5) becomes greater. In other words, as the value of MSE is increased, the film quality of the protective film 73 becomes different from the ideal film quality of the $SiO_2$ film (e.g., the state shown in FIG. 9A) and the film quality becomes poor. Especially, when the value of MSE becomes greater than 10, the $SiO_2$ film is easily peeled off and is not effectively used as a protective film.

Referring to FIG. 10, even if only the flow rate of $O_2$ gas is changed with respect to the flow rate of $SiOl_4$ gas, the MSE does not have certain tendency. This is because even if the flow rate of the $O_2$ gas is decreased, the oxygen contained in the $O_2$ gas is consumed in the generation of $SiO_2$ in the gas, and most of the $SiO_2$ contained in the protective film on the test piece 70 is generated in the gas. Therefore, even if only the flow rate of $O_2$ gas is changed with respect to the flow rate of $SiCl_4$ gas, it is difficult to improve the film quality of the protective film.

Figure 12:
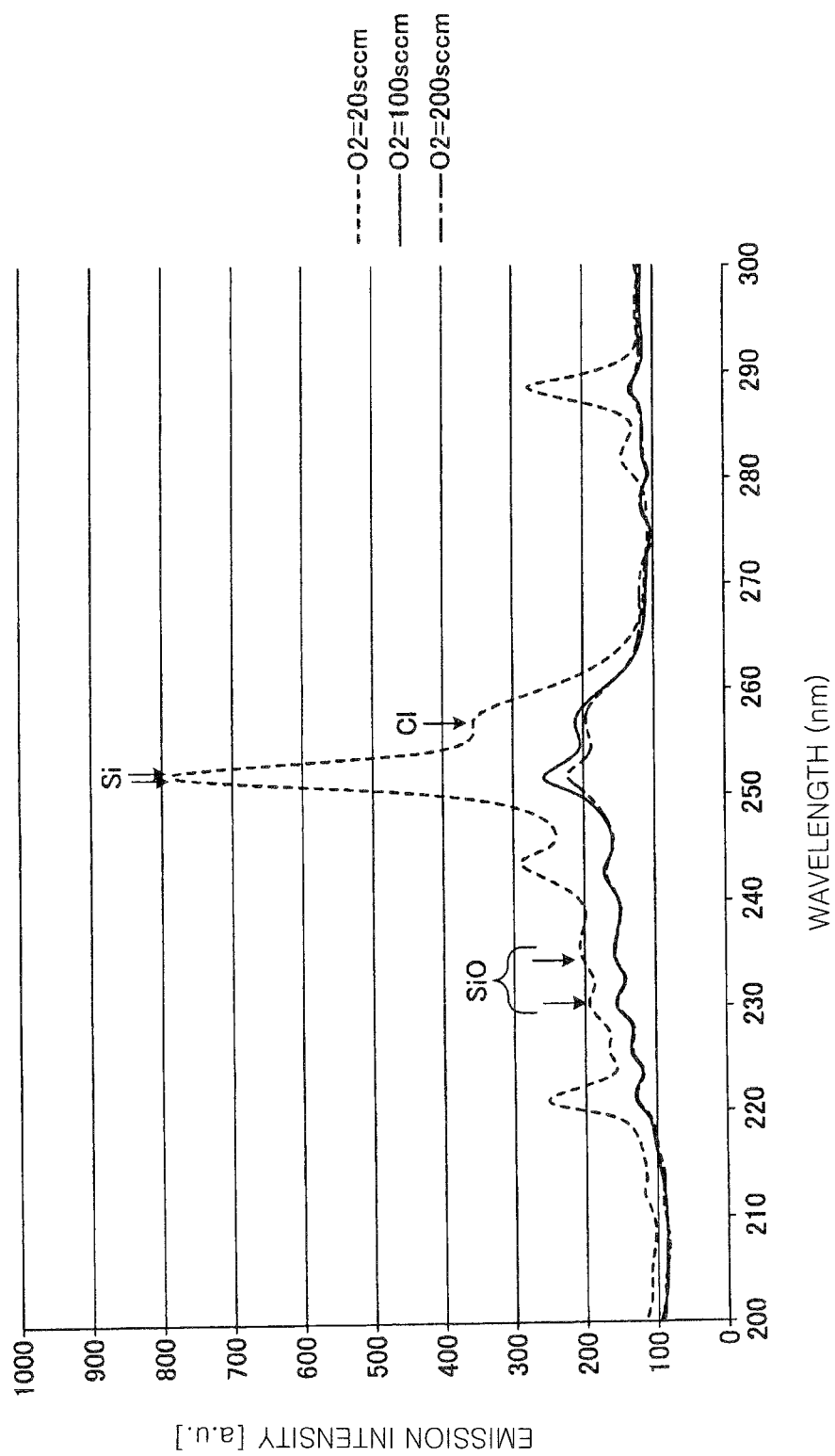
FIGS. 12 and 13 show emission intensity of each element in the case of varying the flow rate of $O_2$ gas in the comparative example 1.
Figure 13:
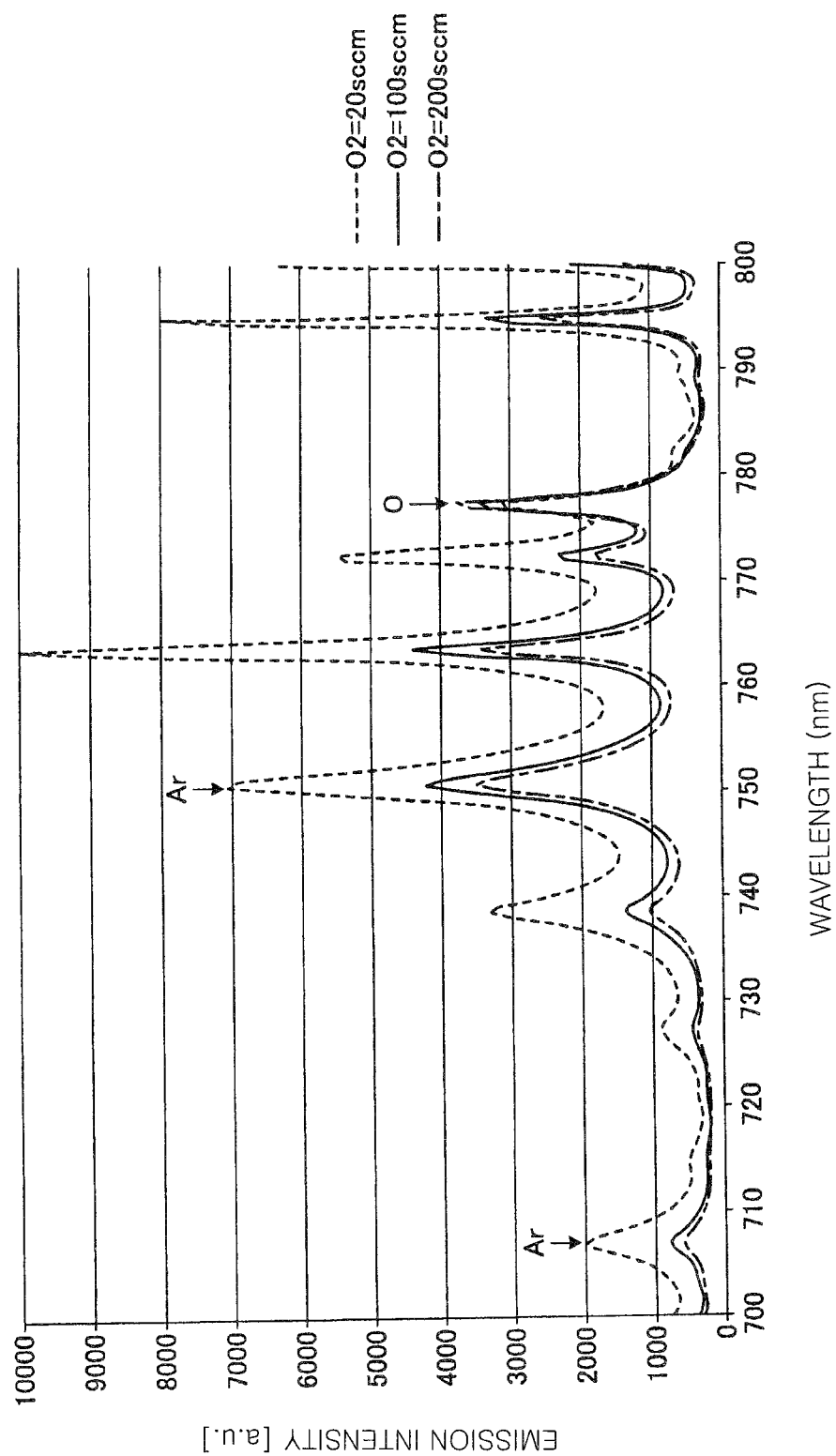

FIGS. 12 and 13 show emission intensities of elements in the case of varying the flow rate of $O_2$ gas in the comparative example 1. As shown in FIG. 13, when the flow rate of $O_2$ gas is decreased, the amount of O* in the processing space S is decreased. However, referring to FIG. 12, there is no change in the peak emission intensity of SiO. Therefore, it is considered that even if the flow rate of $O_2$ gas is decreased, a predetermined amount of $SiO_2$ generated in the gas. Accordingly, the film quality of the protective film deposited on the inner surface of the chamber 12 is not improved.

TEST EXAMPLE 1

Figure 14:
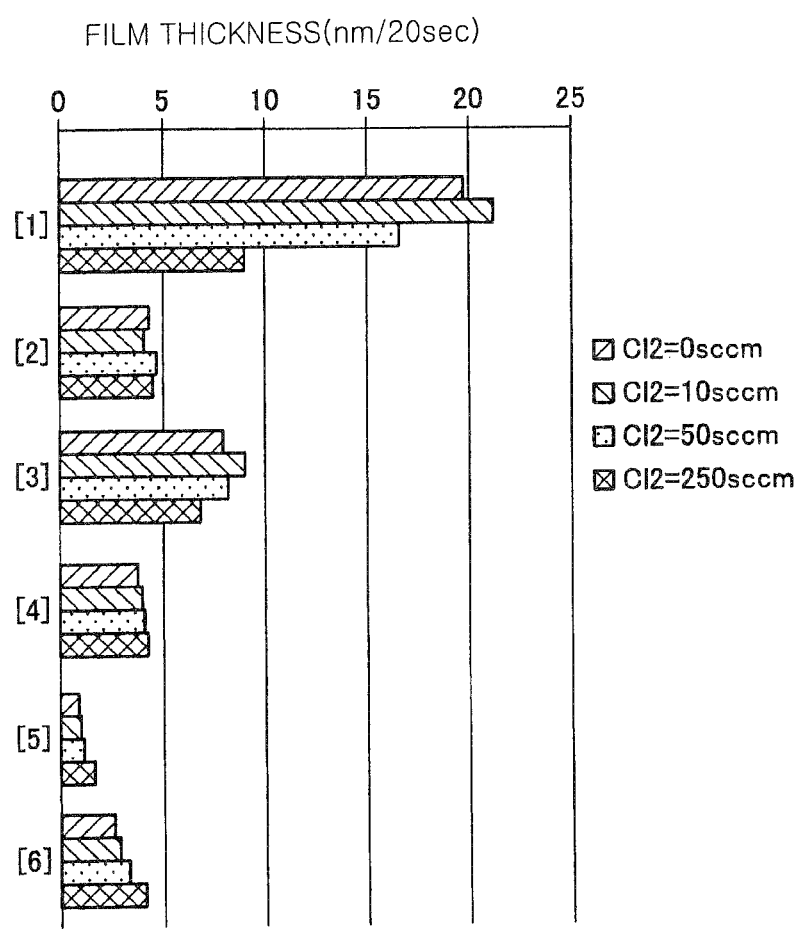
FIG. 14 shows a thickness of a film deposited on a test piece at each position in the case of varying a flow rate of $Cl_2$ gas in a test example 1.

Next, a test was executed in a test example 1 of the present disclosure. FIG. 14 shows a thickness of a protective film deposited on the test piece 70 at each position in the case of varying the flow rate of $Cl_2$ gas in the test example 1. In the test example 1, a gaseous mixture of Ar gas, $SiCl_4$ gas, $O_2$ gas, and $Cl_2$ gas was supplied into the chamber 12. The test shown in FIG. 14 was executed under the following conditions.

Microwave power: 2500 N
Pressure in the chamber 12: 20 mT
RDC: 50%
Flow rate: $Ar/SiCl_4/O_2/Cl_2$=250/10/100/0–250 sccm Referring to FIG. 14, when the flow rate of the $Cl_2$ gas as an additional gas was 50 sccm or more, i.e., at least five times greater than the flow rate of the $SiCl_4$ gas as a compound gas, there was tendency in which the thicknesses of the protective films of the test pieces 70 placed at the positions [1], [3] and [4] near the gas injection ports 18i and 52i were decreased and the thicknesses of the protective films of the test pieces 70 placed at the positions [2], [5] and [6] far from the gas injection port 18i and 52i were increased. In the test of FIG. 14, the flow rate of the $Cl_2$ gas was changed up to 250 sccm, i.e., 25 times greater than the flow rate of the $SiCl_4$ gas. However, when the flow rate of the $Cl_2$ gas was within the range from 50 sccm to 250 sccm, the thickness of the protective film close to the gas injection ports 18i and 52i was decreased and the thickness of the protective film far from the gas injection ports 18i and 52i were increased. In other words, when the flow rate of the $Cl_2$ gas was 5 to 25 times greater than the flow rate of the $SiCl_4$ gas, it was possible to form the protective film having a uniform thickness on the surface of the member in the chamber 12.

This is because the reaction shown in the above formula (1) is suppressed by the addition of $Cl_2$ gas, and molecules of $SiCl_4$ gas are distributed in the chamber 12 and dissociated to Si* and Cl* near the surface of the member in the chamber 12. Si* is adsorbed onto the surface of the member in the chamber 12 and, then, $SiO_2$ is generated on the surface of the member in the chamber 12 by the reaction shown in the above formula (3) or (4).

Figure 15:
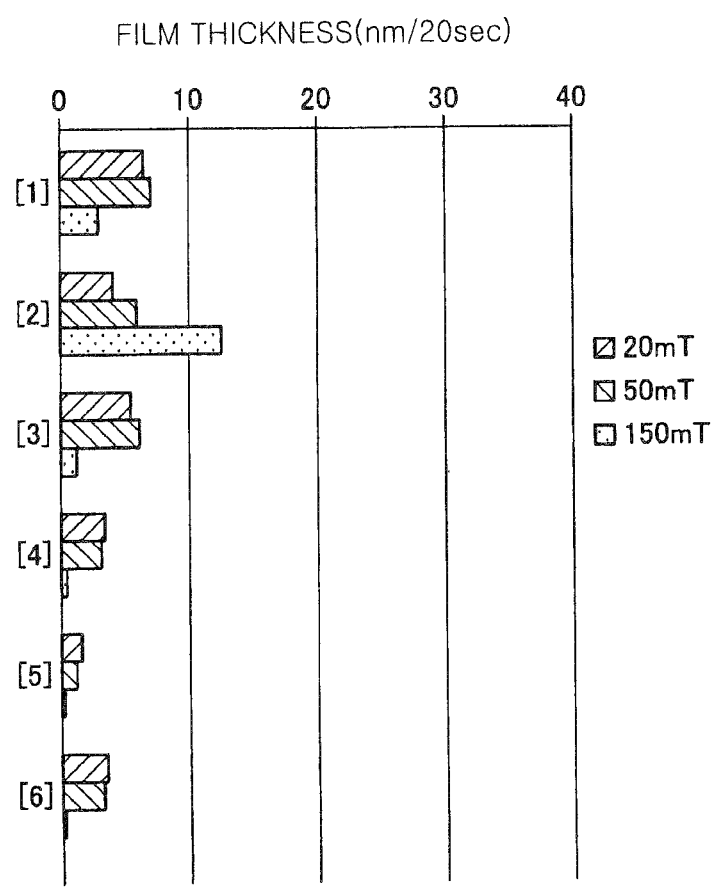
FIG. 15 shows a thickness of a protective film deposited on a test piece at each position in the case of varying a pressure in the test example 1.

The film thickness of the protective film at each position in the case of setting the flow rate of $Cl_2$ gas to 250 sccm and varying the pressure in the chamber 12 is shown in FIG. 15, for example. FIG. 15 shows the thickness of the protective film deposited on the test piece 70 at each position in the case of varying the pressure in the test example 1. The test shown in FIG. 15 was executed under the following conditions.

Microwave power: 1000 W
Pressure in the chamber 12: 20 to 150 mT
RDC: 50%
Flow rate: $Ar/SiCl_4/O_2/Cl_2$=250/10/100/250 sccm Referring to FIG. 15, the protective film tends to be thicker in a region close the plasma source as the pressure in the chamber 12 is increased, and the protective film tends to be deposited more uniformly in the chamber 12 as the pressure in the chamber 12 is decreased. When the plasma processing is performed on the wafer W, in a region where a plasma density is high in the chamber 12, the member in the chamber 12 is damaged by the plasma. Therefore, the protective film may be thickly deposited on a member facing the region where the plasma density is high when the plasma processing is performed on the wafer W. In that case, it is possible to increase the thickness of the protective film deposited in the region where the damage caused by the plasma is considerable by controlling the pressure in the chamber 12.

Figure 16:
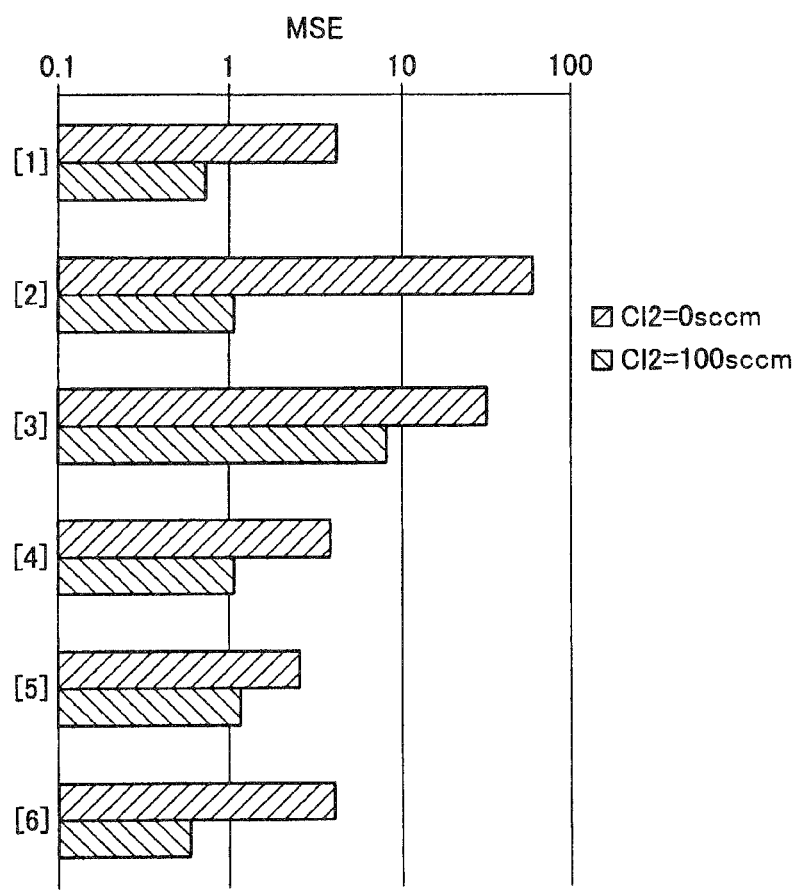
FIG. 16 shows a film quality of the protective film deposited on the test piece at each position in the case of varying the flow rate of $Cl_2$ gas in the test example 1.

FIG. 16 shows the film quality of the protective film deposited on the test piece 70 at each position in the case of varying the flow rate of $Cl_2$ gas in the test example 1. The test shown in FIG. 16 was executed under the following conditions.

Microwave power: 1500 W
Pressure in the chamber 12: 80 mT
RDC: 0%
Flow rate: $Ar/SiCl_4/O_2/Cl_2$=250/20/50/0–100 sccm Referring to FIG. 16, when the flow rate of the $Cl_2$ gas was 100 sccm, the film quality of the protective film was improved in the test pieces 70 at all positions, compared with the case where the flow rate of the $Cl_2$ gas was 0 sccm. This is because the reaction shown in the above formula (1) was suppressed by the addition of $Cl_2$ gas; molecules of $SiCl_4$ gas spread uniformly in the chamber 12; and the amount of $SiO_2$ generated in the gas was reduced.

Figure 17:
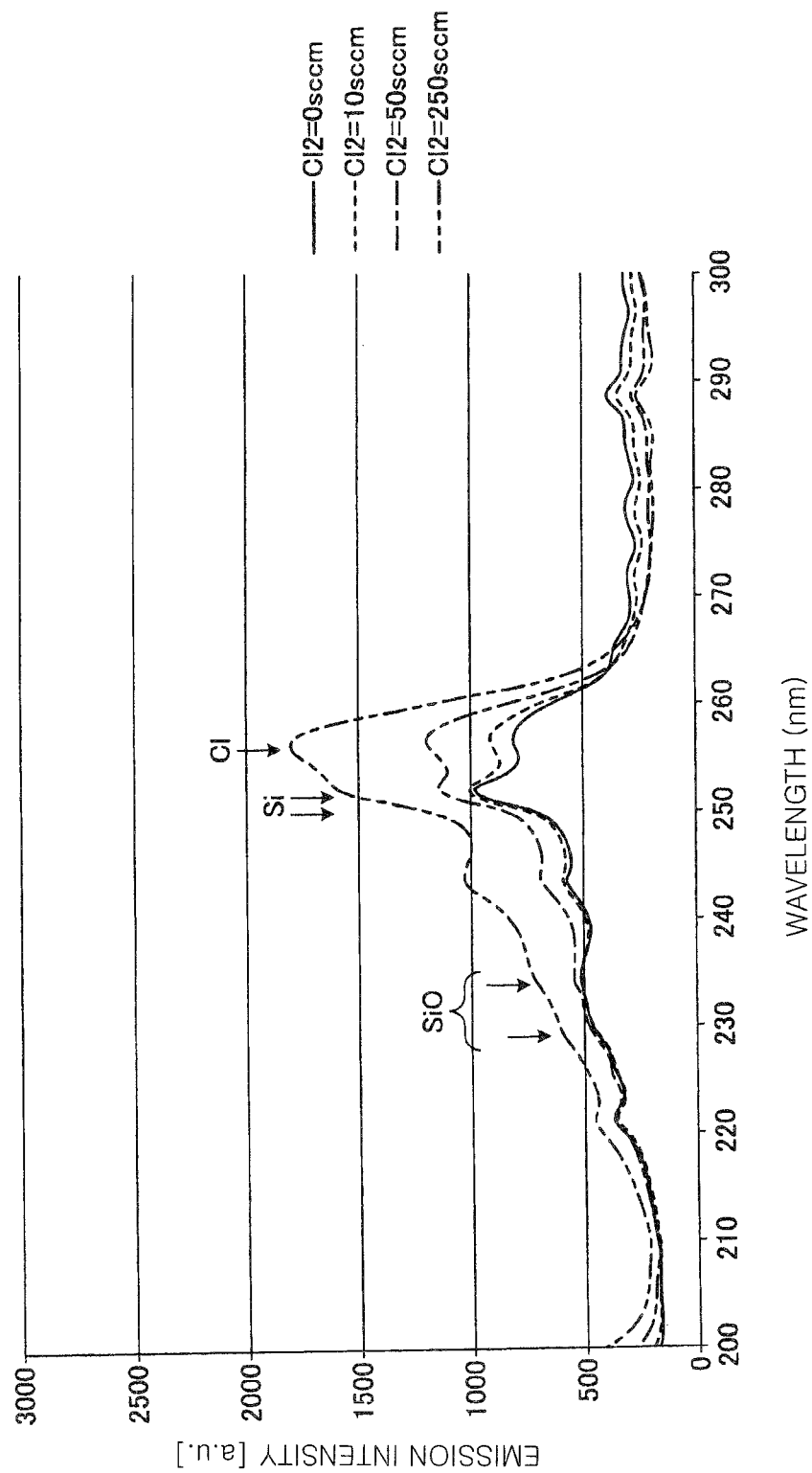
FIGS. 17 and 18 show emission intensity of each element in the case of varying the flow rate of $Cl_2$ gas in the test example 1.
Figure 18:
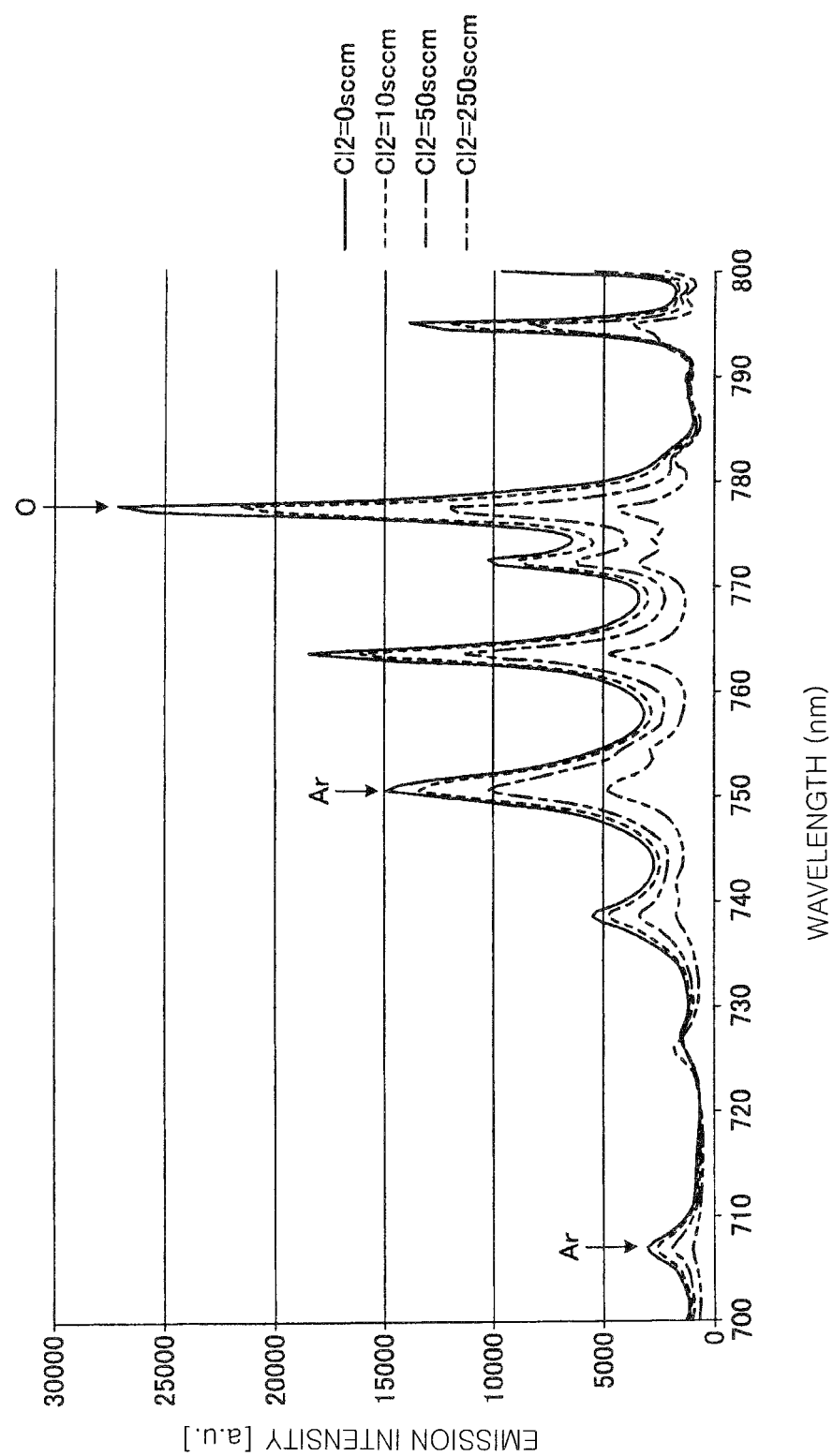

FIGS. 17 and 18 show emission intensities of elements in the case of varying the flow rate of $Cl_2$ gas in the test example 1. As shown in FIG. 17, as the flow rate of $Cl_2$ gas is increased, the emission intensity of Cl is increased in the processing space S and, also, the concentration of Cl* in the processing space S is increased. On the other hand, as shown in FIG. 17 as the flow rate of $Cl_2$ gas is increased, the emission intensity of Si is decreased in the processing space S and, also, the concentration of Si in the processing space S is decreased. This is because the addition of $Cl_2$ gas suppresses the reaction shown in the above formula (1) rather than the reaction shown in the above formula (2).

As shown in FIG. 17, as the flow rate of $Cl_2$ gas is increased, the peak emission intensity of $SiO_2$ is decreased. Therefore, the generation of SiO in the gas is suppressed. Accordingly, $SiO_2$ is generated by the reaction shown in the above formula (3) or (4) after Si* is adsorbed onto the surface of the member in the chamber 12, and the film quality of the protective film is improved.

Referring to FIG. 18, the emission intensity of O is decreased as the flow rate of $Cl_2$ gas is increased. Molecules of $Cl_2$ gas have higher reactivity than those of $O_2$ gas. Therefore, the molecules of $Cl_2$ gas absorb more plasma energy, compared to those of $O_2$ gas, and tend to be Cl*. Accordingly, the energy for dissociating $O_2$ molecules to O* is decreased and the amount of O* in the gas is decreased. When the amount of O* in the gas is decreased, the reaction shown in the above formula (4) is suppressed and the generation of $SiO_2$ in the gas is suppressed. As a consequence, $SiO_2$ is generated by the reaction shown in the above formula (3) or (4) after Si* is adsorbed onto the surface of the member in the chamber 12, and the film quality of the protective film formed on the surface of the member in the chamber 12 is improved.

COMPARATIVE EXAMPLE 2

Figure 19:
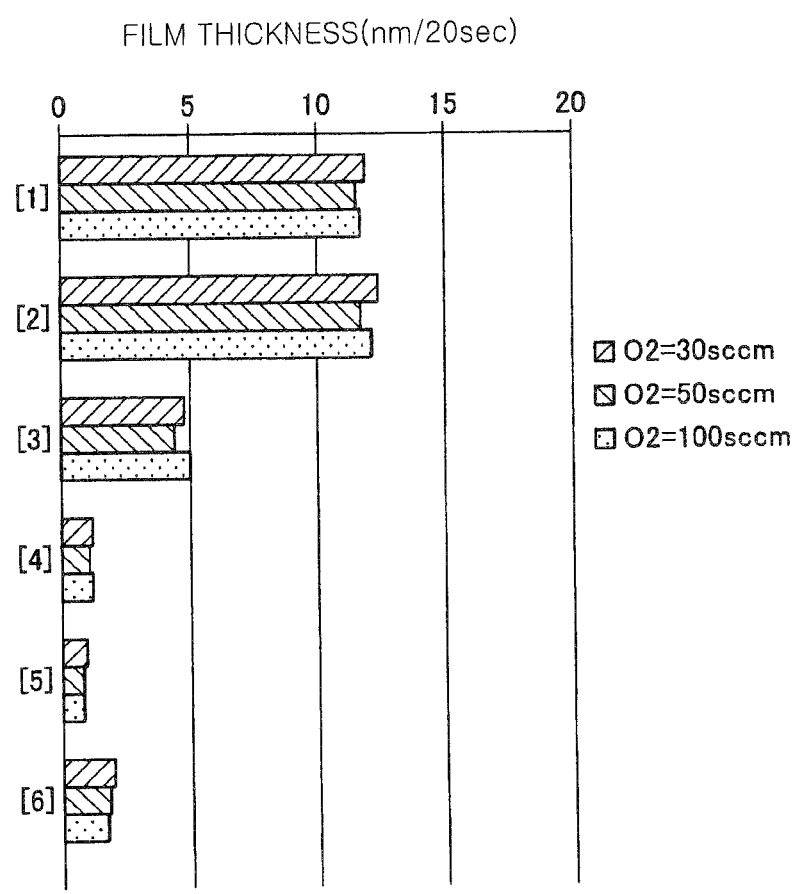
FIG. 19 shows a film thickness of a protective film deposited on a test piece at each position in the case of varying a flow rate of $O_2$ gas in a comparative example 2.

Next, in a comparative example 2, a test for varying the flow rate of $O_2$ gas in the gaseous mixture added with $Cl_2$ gas was executed. FIG. 19 shows the film thickness of the protective film deposited on the test piece 70 at each position in the case of varying the flow rate of $O_2$ gas in the comparative example 2. In the comparative example 2, in the protective film forming process, a gaseous mixture of Ar gas, $SiCl_4$ gas, $O_2$ gas and $Cl_2$ gas was supplied from a plurality of gas injection ports 52*i* provided along the sidewall 12*a* of the chamber 12 into the chamber 12. The other conditions are as follows.

Microwave power: 1000 W
Pressure in the chamber 12: 80 mT
RDC: 0%
Flow rate: $Ar/SiCl_4/O_2/Cl_2$=500/20/30–100/250 sccm For example, as shown in FIG. 19, the film thickness of the protective film deposited on the test piece 70 at each position was hardly changed despite the changes in the flow rate of $O_2$ gas.

Figure 20:
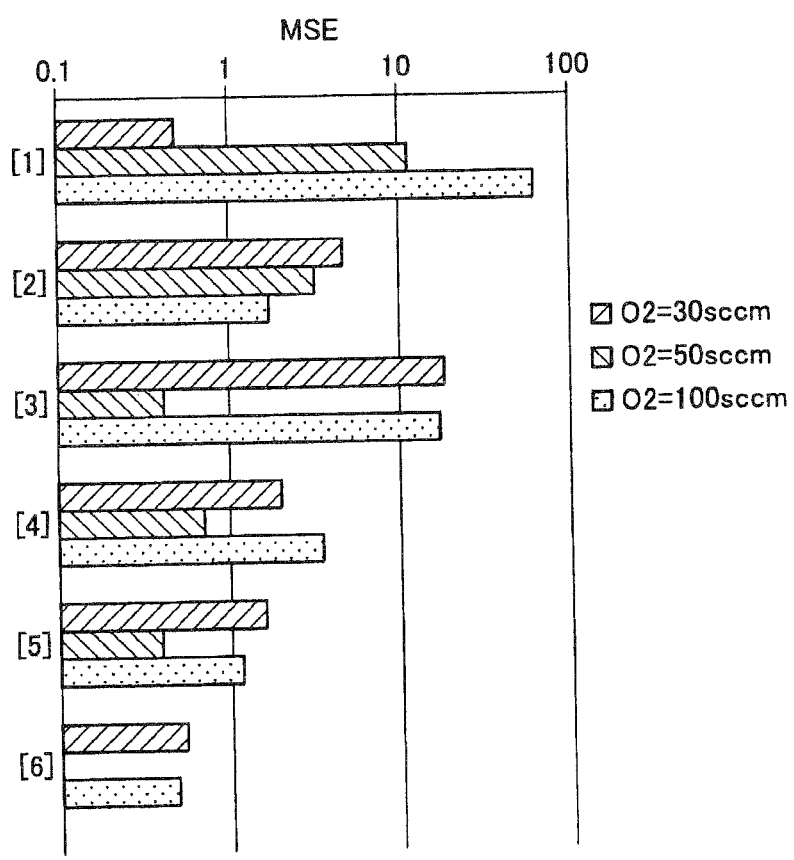
FIG. 20 shows a film quality of the protective film deposited on the test piece at each position in the case of varying the flow rate of $O_2$ gas in the comparative example 2.

FIG. 20 shows the film quality of the protective film deposited on the test piece 70 at each position in the case of varying the flow rate of $O_2$ gas in the comparative example 2. For example, as shown in FIG. 20, when the flow rate of $O_2$ gas was changed, the film quality of the protective film deposited on the test piece 70 was changed depending on positions in the chamber 12.

In the plasma processing apparatus 10 of the present embodiment, in order to realize uniformity of the processing for the wafer the distribution of the gas or the distribution of the microwave radiated from the antenna 14 is controlled such that the density of the plasma becomes uniform directly above the wafer W mounted on the electrostatic chuck ESC. However, in the plasma processing apparatus 10 for generating the plasma and irradiating particles of the plasma onto the wafer W by diffusing the plasma above the wafer W, the plasma density directly above the wafer W may be deviated in a central portion or an outer peripheral portion of the wafer W depending on the size of the space in the chamber 12, the shape of the antenna 14, or the like. In order to correct the deviation, the plasma density may be intentionally made to be uneven in the sidewall 12*a* in the chamber 12, the lower surface 18*b* of the dielectric window 18, and the like.

For example, according to the test result of FIG. 20, when the flow rate of the $O_2$ gas is 30 sccm, the values of MSE of the protective film deposited on the test pieces 70 placed at the positions [1] and [6] are smaller than the values of MSE of the protective film deposited on the test pieces 70 placed at the positions [2] and [3]. This is because when the flow rate of $O_2$ gas is 30 sccm, the relation such as the energy of the microwave, the gas concentration or the like in the positions [1] and [6] are close to the condition in which a high-density plasma is generated, compared to that in the positions [2] and [3]. In the high-density plasma region, the value of MSE is decreased and a high-quality protective film is formed.

According to the test result of FIG. 20, when the flow rate of $O_2$ gas is 100 sccm, the values of MSE of the protective film deposited on the rest pieces 70 placed at the positions [2] and [6] are smaller than the values of MSE of the protective film deposited on the test pieces 70 placed at the positions [1] and [3]. This is because the relation such as energy of the microwave radiated from the antenna 14, the gas concentration the like in the positions [2] and [6] is close to the condition in which a high-density plasma is generated, compared to that in the positions [1] and [3].

when the film quality of the protective film formed on the surface of the member in the chamber 12 is poor, the surface of the protective film tends to be peeled off during the execution of the processing for the wafer W. Especially, when a part of the surface of the protective film formed on the lower surface 18*b* of the dielectric window 18 is peeled off, the protective film peeled off from the lower surface 18*b* of the dielectric window 18 becomes particles and tends to be adhered onto the surface of the wafer W positioned below the dielectric window 18. Therefore, it is important to improve the film quality of the protective film formed on the lower surface 18*b* of the dielectric window 18, among the protective films formed on the surfaces of the members in the chamber 12.

In the plasma processing apparatus 10 of the present embodiment, as shown in FIGS. 1 and 3 to 5, the dielectric window 18 is formed in a substantially disc shape, and the first recess 181 and the second recesses 182 defined by a portion having a comparatively thin thickness are formed around the central axis where the gas injection port 18*i* is formed. The energy of the microwave propagated from the slot plate 44 to the dielectric window 18 is concentrated on positions directly below the dielectric window 18 which correspond to the positions of the first recess and the second recesses 182. Therefore, the energy of the microwave is low at the position of the lower surface 18*b* of the dielectric window 18 where the gas injection port 18*i* is formed, and the energy of the microwave is high at the position directly below the first recess 181 and the second recesses 182. In other word, the energy of the microwave at the position [2] is greater than the energy of the microwave at the position

[1]. Accordingly, when only the flow rate of $O_2$ gas is changed, even if the condition in one of the positions [1] and [2] becomes close to the condition in which a high-density plasma is generated, the condition in the other position may not become close to the condition in which a high-density plasma is generated, and it is difficult to improve the film quality of the protective film formed at both positions.

TEST EXAMPLE 2

Figure 21:
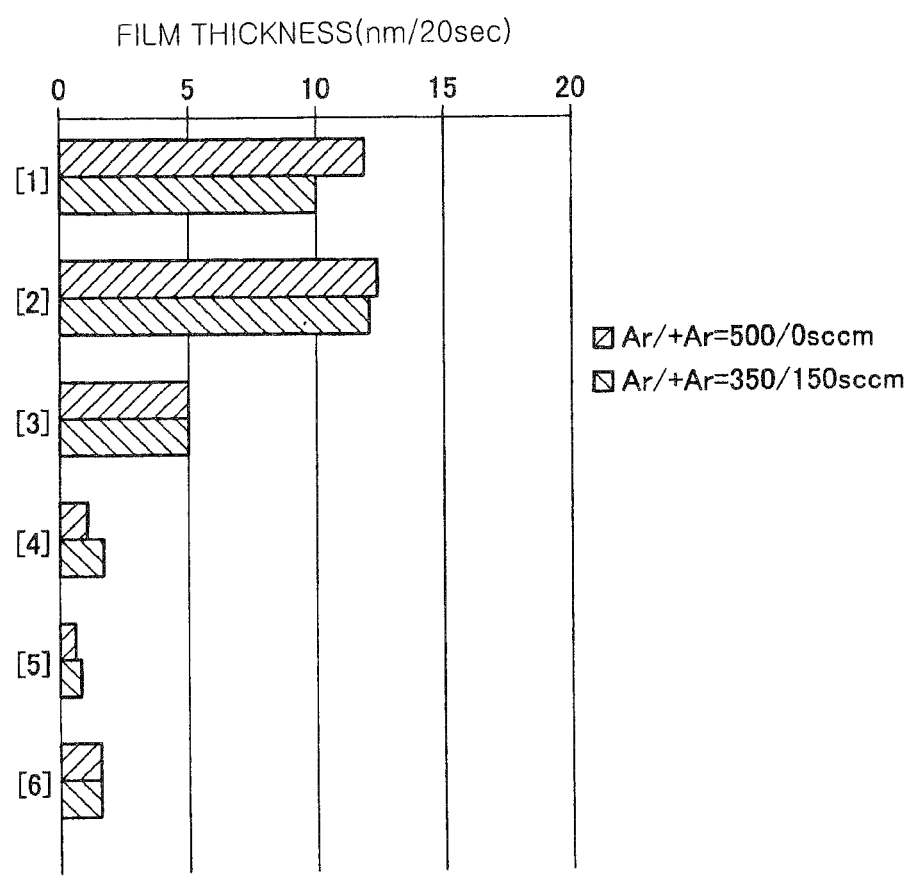
FIG. 21 shows film thickness of a protective film deposited on a test piece at each position in the case of supplying Ar gas from a gas injection port of a dielectric window in a test example 2.
Figure 22:
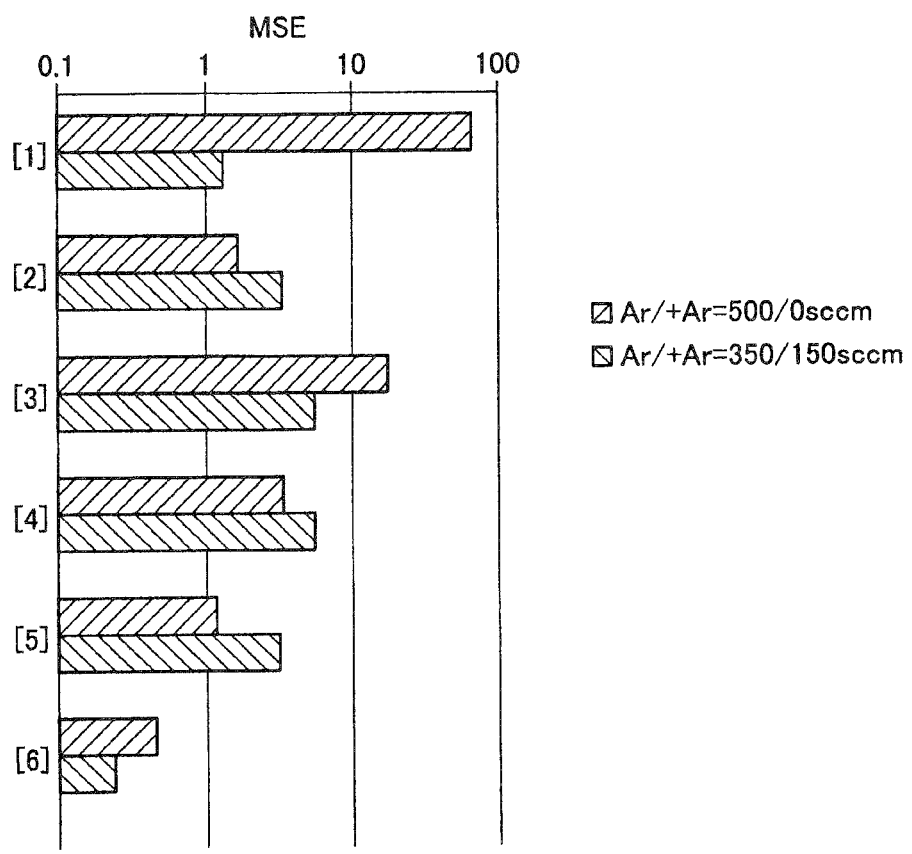
FIG. 22 shows a film quality of the protective film deposited on the test piece at each position in the case of supplying Ar gas from the gas it port of the dielectric window in the test example 2.

Next, a test was executed in a test example 2 of the present disclosure. FIG. 21 shows the thickness of the protective film deposited on the test piece 70 at each position in the case of supplying Ar gas from the gas injection port 18i of the dielectric window 18 in the test example 2. FIG. 22 shows the film quality of the protective film deposited on the test piece 70 at each position in the case of supplying Ar gas from the gas injection port 18i of the dielectric window 18 in the test example 2. In the test example 2, a gaseous mixture of Ar gas, $SiCl_4$ gas, $O_2$ gas and $Cl_2$ gas is supplied into the chamber 12 from a plurality of gas injection ports 52i provided along the sidewall 12a of the chamber 12. Ar gas is supplied into the chamber 12 from the gas injection port 18i of the dielectric window 18. FIG. 21 shows test results including the test result obtained when the flow rate of $O_2$ gas is 100 sccm among the results shown in FIG. 19. FIG. 22 shows test results including the test result obtained when the flow rate of $O_2$ gas is 100 sccm among the test results shown in FIG. 20. The tests shown in FIGS. 21 and 22 were executed under the following conditions.

Microwave power: 1000 W
Pressure in the chamber 12: 80 mT
Flow rate: Ar/+Ar/$SiCl_4$/$O_2$/$Cl_2$=350-500/0-150/20/100/250 sccm
Ar gas flow ratio: 0% (+Ar/Ar=0/500 sccm)
Ar gas flow rate ratio: 30% (+Ar/Ar=150/350 sccm)

In the above conditions, "+Ar" indicates the flow rate of Ar gas supplied into the chamber 12 from the gas injection port 18i, and the other gas flow rates indicate the flow rates of gases supplied into the chamber 12 from the gas in ports 52i.

For example, as shown in FIG. 21, even if the flow rate ratio of Ar gas is changed from 0% to 30%, the thickness of the protective film formed. on the test piece 70 at each of the positions [1] to [6] is hardly changed.

On the other hand, as shown in FIG. 22, for example, when the flow rate ratio of Ar gas was changed from 0% to 30%, the film quality of the protective film formed on the test piece 70 at each of the positions [1] to [6] was changed. Specifically, the value of MSE indicating the film quality of the protective film of the test piece 70 at the position [1] was considerably Improved from about 80 to about 1.5 by changing the flow rate ratio of Ar gas from 0% to 30%. This is because the density of Ar gas near the gas injection port 18i of the dielectric window 18 was increased and the plasma density near the position [1] was increased by changing the flow rate ratio of Ar gas from 0% to 30%.

Although the value of MSE of the protective film of the test piece 70 at the position [2] deteriorated slightly from about 2 to about by changing the flow rate ratio of Ar gas from 0% to 30%, a high film quality was maintained. The value of MSE of the protective film of the test piece 70 at the other positions was also changed slightly. However, there was no abrupt change.

A maximum value of MSE of the protective film in the positions [1] and corresponding to the position of the lower surface 18b of the dielectric window 18 is considerably improved from about 80 to about 4 by changing the flow rate ratio of Ar gas from 0% to 30%. The plasma density near the gas injection port 18i having a comparatively low microwave energy can be increased by supplying Ar gas from the gas injection port 18i of the dielectric window 18. Accordingly, the film quality of the protective film formed on the lower surface 18b of the dielectric window 18 can be improved.

As apparent from the description of the embodiment of the plasma processing apparatus 10, in accordance with the plasma processing apparatus 10 of the present embodiment, a dense protective film can be more uniformly formed on the surface of the member in the chamber 12. Further, in accordance with the plasma processing apparatus 10 of the present embodiment, the reaction shown in the above formula (1) is suppressed by the addition of $Cl_2$ gas, and molecules of $SiCl_4$ gas spread in the chamber 12. Thus, the generation of $SiO_2$ in the gas inside the gas injection ports 18i and 52i is suppressed, and it is possible to prevent the gas injection ports 18i and 52i from being blocked by $SiO_2$ generated in the gas.

By supplying the gaseous mixture of Ar gas, $SiCl_4$ gas, $O_2$ gas and $Cl_2$ gas into the chamber 12 from the gas injection ports 52i provided along the sidewall 12a of the chamber 12 and supplying Ar gas into the chamber from the gas injection port 18i of the dielectric window 18, the film quality of the protective film formed on the lower surface 18b of the dielectric window 18 can be improved.

(Other Applications)

The present disclosure is not limited to the above-described embodiment, and various modifications can be made within the scope of the gist thereof.

For example, in the above-described embodiment, $Cl_2$ gas is used as an additional gas. However, the present disclosure is not limited thereto, and another gas may be used as long as it contains the same halogen element as the halogen element contained in the compound gas and does not contain a silicon element. Specifically, at least one of $Cl_2$ gas, HCl gas, $BCl_3$ gas, $CCl_4$ gas, or $CH_2Cl_2$ gas may be used as an additional gas.

In the above-described embodiment, $O_2$ gas is used as the oxygen-containing gas. However, the present disclosure is not limited thereto. For example, a gas containing at least one of $O_2$ gas, CO gas, or $CO_2$ gas may be used as the oxygen-containing gas.

In the above-described embodiment, $SiCl_4$ gas is used as the compound gas. However, the present disclosure is not limited thereto, and $SiF_4$ gas may be used as the compound gas. When $SiF_4$ gas is used as the compound gas, a gas containing the same halogen element as the halogen element contained in the compound gas and no silicon element is used as the additional can. Specifically, at least one of $NF_3$ gas, $SF_6$ gas, HF gas, $CF_4$ gas, or $CHF_3$ gas is used as the additional gas.

In the above-described embodiment, the plasma processing apparatus 10 performs microwave plasma processing using RLSA. However, the present disclosure is not limited thereto, and may also be applied to a plasma processing apparatus using a CCP (Capacitively Coupled Plasma), an ICP (Inductively Coupled Plasma), or the like.

In the above-described embodiment, before the wafer W is subjected to predetermined processing (step S14 shown in FIG. 6) such as etching, film formation or the like, in the process (step S12 shown in FIG. 6) of forming a containing film as a protective film on a surface of a member in the chamber 12, the gas containing the same halogen element as the halogen element contained in the compound gas and no silicon element was added to the oxygen-containing gas and the compound gas (precursor gas) containing a silicon element and the halogen element. However, the present disclosure is not limited thereto.

For example, in the case of forming a silicon oxide film on the wafer W by using the gas containing the compound gas (precursor gas) containing a silicon element and a halogen element and the oxygen-containing gas in the step S14 shown in FIG. 6, a gas containing the same halogen element as the halogen element contained in the compound gas and no silicon element may be added. In that case, the silicon oxide film is deposited on the wafer W and also deposited as reaction by-products (so-called deposits) on the surface of the member in the chamber 12, other than the wafer W. These deposits can be more uniformly deposited on the surface of the member in the chamber 12, other than the wafer W. Accordingly, it is possible to protect the surface of the member in the chamber 12 other than the wafer W, and also possible to reduce damages inflicted on the surface of the member at the time of removing the silicon oxide film from the surface of the member.

In the above embodiment, Ar gas is used as a rare gas. However, a rare gas other than Ar gas may be used. Instead of Ar gas, a gaseous mixture of a plurality of rare gases including Ar gas may be used. In the example in which the gaseous mixture of Ar gas, $SiCl_4$ gas, $O_2$ gas, and $Cl_2$ gas is supplied from the gas injection ports 52$i$ and Ar gas is supplied from the gas injection port 18$i$, the rare gas supplied from the gas injection ports 52$i$ may be different from the rare gas supplied from the gas injection port 18$i$.

In the test example 2, the gaseous mixture of Ar gas, $SiCl_4$ gas, $O_2$ gas and $Cl_2$ gas is supplied from the gas injection ports 52$i$ and Ar gas is supplied from the gas injection port 18$i$. However, the gaseous mixture of $SiCl_4$ gas, $O_2$ gas and $Cl_2$ gas may be supplied from the gas injection ports 52$i$, and Ar gas may be supplied only from only the gas injection port 18$i$.

While the present disclosure has been shown and described with respect to the embodiments, it will be understood by those skilled in the art that various changes and modifications may be made without departing from the scope of the present disclosure as defined in the following claims.

What is claimed is:

1. A plasma processing method of forming a protective film comprising:
   supplying into a chamber a gaseous mixture which contains a compound gas containing a silicon element and a halogen element, an oxygen-containing gas, and an additional gas containing the same halogen element as the halogen element contained in the compound gas, no silicon element, and no carbon element, the gaseous mixture containing no metal element; and
   forming the protective film on a surface of a member in the chamber by a plasma of the gaseous mixture supplied into the chamber, wherein the plasma which forms the protective film does not contain a metal.

2. The plasma processing method of forming the protective film of claim 1, wherein a flow rate of the additional gas is at least five times greater than a flow rate of the compound gas.

3. The plasma processing method of forming the protective film of claim 2, wherein the flow rate of the additional gas is 5 to 25 times greater than the flow rate of the compound gas.

4. The plasma processing method of forming the protective film of claim 1, wherein the compound gas is $SiCl_4$ gas or $SiF_4$ gas.

5. The plasma processing method of forming the protective film of claim 4, wherein the compound gas is $SiCl_4$ gas, and the additional gas includes at least one of $Cl_2$ gas, HCl gas, or $BCl_3$ gas.

6. The plasma processing method of forming the protective film of claim 4, wherein the compound gas is $SiF_4$ gas, and the additional gas includes at least one of $NF_3$ gas, $SF_6$ gas, or HF gas.

7. The plasma processing method of forming the protective film of claim 1, wherein the oxygen-containing gas includes at least one of $O_2$ gas, CO gas, and $CO_2$ gas.

8. The plasma processing method of forming the protective film of claim 1, in combination with further processing including:
   loading a target substrate into the chamber after said forming;
   supplying a processing gas into the chamber and processing the target substrate by using plasma of the processing gas after said loading;
   unloading the target substrate from the chamber after said processing; and
   supplying a fluorine-containing gas into the chamber and removing the protective film in the chamber by using plasma of the fluorine-containing gas after said unloading,
   wherein said supplying the gaseous mixture and said forming are executed again after said removing.

9. The plasma processing method of forming the protective film of claim 1, wherein the chamber has a substantially cylindrical sidewall and an upper ceiling plate provided at an upper portion of the sidewall, and
   in said supplying, the compound gas, the oxygen-containing gas, and the additional gas are supplied into the chamber from a plurality of sidewall gas supply ports provided along the sidewall, and a rare gas is further supplied into the chamber from a ceiling plate gas supply port provided on an axis of the substantially cylindrical sidewall and disposed at a lower surface of the upper ceiling plate.

10. A plasma processing apparatus in which a protective film is formed comprising:
   a chamber;
   a gas supply unit configured to supply into the chamber a gaseous mixture of a compound gas which contains a silicon element and a halogen element, an oxygen-containing gas, and an additional gas containing the same halogen element as the halogen element contained in the compound gas, no silicon element, and no carbon element, the gaseous mixture containing no metal element; and
   a plasma generation unit configured to generate a plasma of the gaseous mixture in the chamber to form the protective film on a surface of a member in the chamber, wherein the plasma which forms the protective film does not contain a metal.

* * * * *